US009053806B2

(12) United States Patent
Kono

(10) Patent No.: US 9,053,806 B2
(45) Date of Patent: Jun. 9, 2015

(54) SEMICONDUCTOR DEVICE

(71) Applicant: Renesas Electronics Corporation, Kawasaki-shi, Kanagawa (JP)

(72) Inventor: Takashi Kono, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/062,782

(22) Filed: Oct. 24, 2013

(65) Prior Publication Data

US 2014/0177341 A1 Jun. 26, 2014

(30) Foreign Application Priority Data

Oct. 24, 2012 (JP) .................... 2012-234523

(51) Int. Cl.
*G11C 11/34* (2006.01)
*G11C 16/26* (2006.01)

(52) U.S. Cl.
CPC ...................... *G11C 16/26* (2013.01)

(58) Field of Classification Search
CPC ................. G11C 16/26; G11C 16/10
USPC ....................... 365/185.21, 185.24
See application file for complete search history.

(56) References Cited

U.S. PATENT DOCUMENTS

| 7,123,531 | B2* | 10/2006 | Rho | 365/208 |
| 7,389,097 | B2* | 6/2008 | Tamura | 455/280 |
| 8,199,859 | B2* | 6/2012 | Zerbe et al. | 375/320 |
| 8,320,211 | B1* | 11/2012 | Chang et al. | 365/210.11 |
| 8,605,521 | B2* | 12/2013 | Vimercati | 365/189.15 |

FOREIGN PATENT DOCUMENTS

JP 2011-175689 A 9/2011

OTHER PUBLICATIONS

Meng-Fan Chang et al., "An Offset-Tolerant Current-Sampling-Based Sense Amplifier for Sub-100nA-Cell Current Nonvolatile Memory", IEEE International Solid-State Circuits Conference, Dig. of Tech. Papers, pp. 206-208, 2011.

* cited by examiner

*Primary Examiner* — Michael Tran
(74) *Attorney, Agent, or Firm* — McDermott Will & Emery LLP

(57) ABSTRACT

In this flash memory, after first and second nodes are precharged to a power supply voltage, a sense amplifier is activated, and signals appearing at the first and second nodes are held in a register. With output signals of the register, a transistor is rendered conductive, so that a constant current source for offset compensation is connected to the first or second node. Accordingly, the offset voltage of the sense amplifier can be compensated for with a simple configuration.

10 Claims, 15 Drawing Sheets

FIG.4
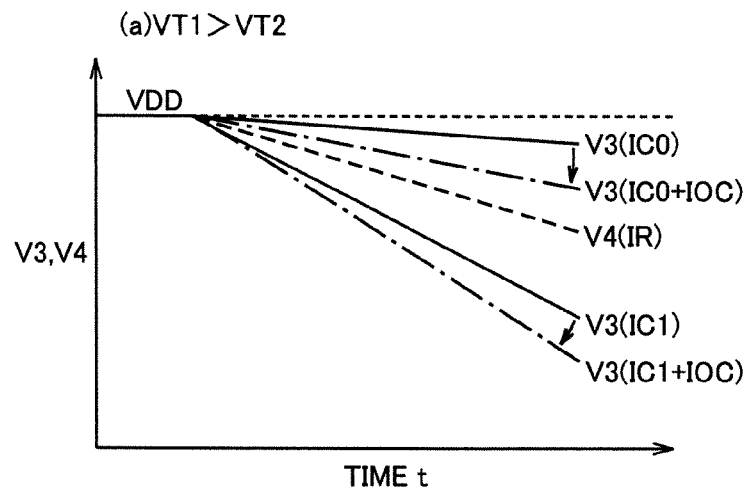
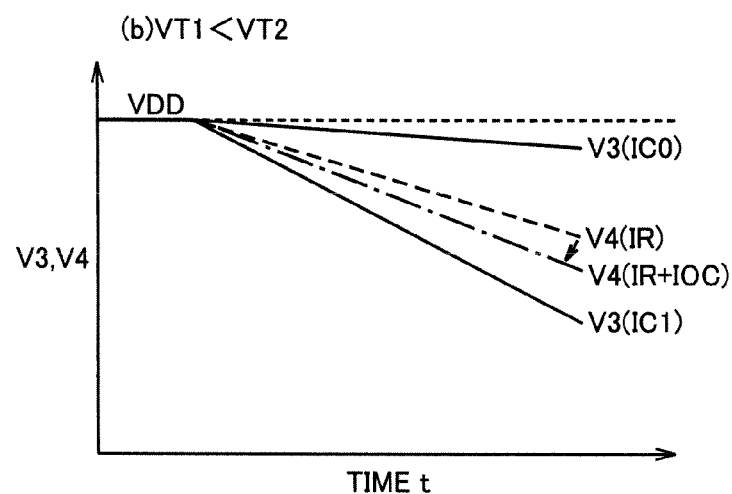

SEMICONDUCTOR DEVICE

BACKGROUND OF THE INVENTION

1. Field of the Invention

The present invention relates to a semiconductor device and can be suitably used, for example, in a semiconductor device with a sense amplifier.

2. Description of the Background Art

Conventionally, semiconductor devices are provided with sense amplifiers that amplify a minute voltage read out from a memory cell to a power supply voltage. A variety of offset compensation circuits for compensating for the offset voltage of sense amplifiers have been proposed.

In the offset compensation circuit according to M.-F. Chang, S.-J. Shen, C.-C. Liu, C.-W. Wu, Y.-F. Lin, S.-C. Wu, C.-E. Huang, H.-C. Lai, Y.-C. King, C.-J. Lin, H.-J. Liao, Y.-D. Chih, H. Yamauchi, "An Offset-Tolerant Current-Sampling-Based Sense Amplifier for Sub-100 nA-Cell-Current Nonvolatile Memory", IEEE International Solid-State Circuits Conference, Dig. of Tech. Papers, pp. 206-208, 2011, first, two P-channel MOS transistors of a sense amplifier are diode connected, cell current and reference current are fed to the two transistors, respectively, and the gate-source voltages of the two transistors are held by respective two capacitors. Here, the gate-source voltages obtained by correcting the difference between the threshold voltages of the two transistors are held by the two capacitors. Next, the two transistors are cross-coupled to start a sense operation.

An offset compensation circuit in Japanese Patent Laying-Open No. 2011-175689 has a sense amplifier connected between two data buses. After the two data buses are precharged to a predetermined voltage, electric charge of one data bus is distributed to a capacitor to reduce the voltage of the data bus, so that the sense amplifier is activated to store a read data signal. This operation is performed with the capacitance value of the capacitor being changed to a plurality of stages for each data bus. The capacitance value of the capacitor connected to the data bus in a read operation is determined based on a plurality of stored read data signals.

In the above-noted non-patent document, two capacitors are charged every read operation, thereby decelerating the read speed.

In Japanese Patent Laying-Open No. 2011-175689, the read data signals are stored with the capacitance value of the capacitor being changed to a plurality of stages for each data bus, and the capacitance value of the capacitor is determined based on a plurality of stored read data signals. This leads to complication of the configuration.

SUMMARY OF THE INVENTION

In a semiconductor device according to an embodiment of the present invention, a sense amplifier is activated after first and second nodes are precharged to the same voltage, and, based on an output signal of the sense amplifier at this moment, the voltage of the first or second node is reduced.

According to an embodiment, the read speed can be accelerated with a simple configuration.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a time chart for explaining an offset voltage of the sense amplifier shown in FIG. 3 and a compensation method thereof.

DESCRIPTION OF THE PREFERRED EMBODIMENTS

[First Embodiment]

The application of present invention is not limited to any particular memory. The present invention is applicable to any of a nonvolatile memory, a volatile memory, a general memory, and an embedded memory, and is not limited to any particular memory cell configuration. Here, the present invention is applied to an embedded nonvolatile flash memory for a microcontroller with a split gate-type memory cell, by way of example.

Figure 1:
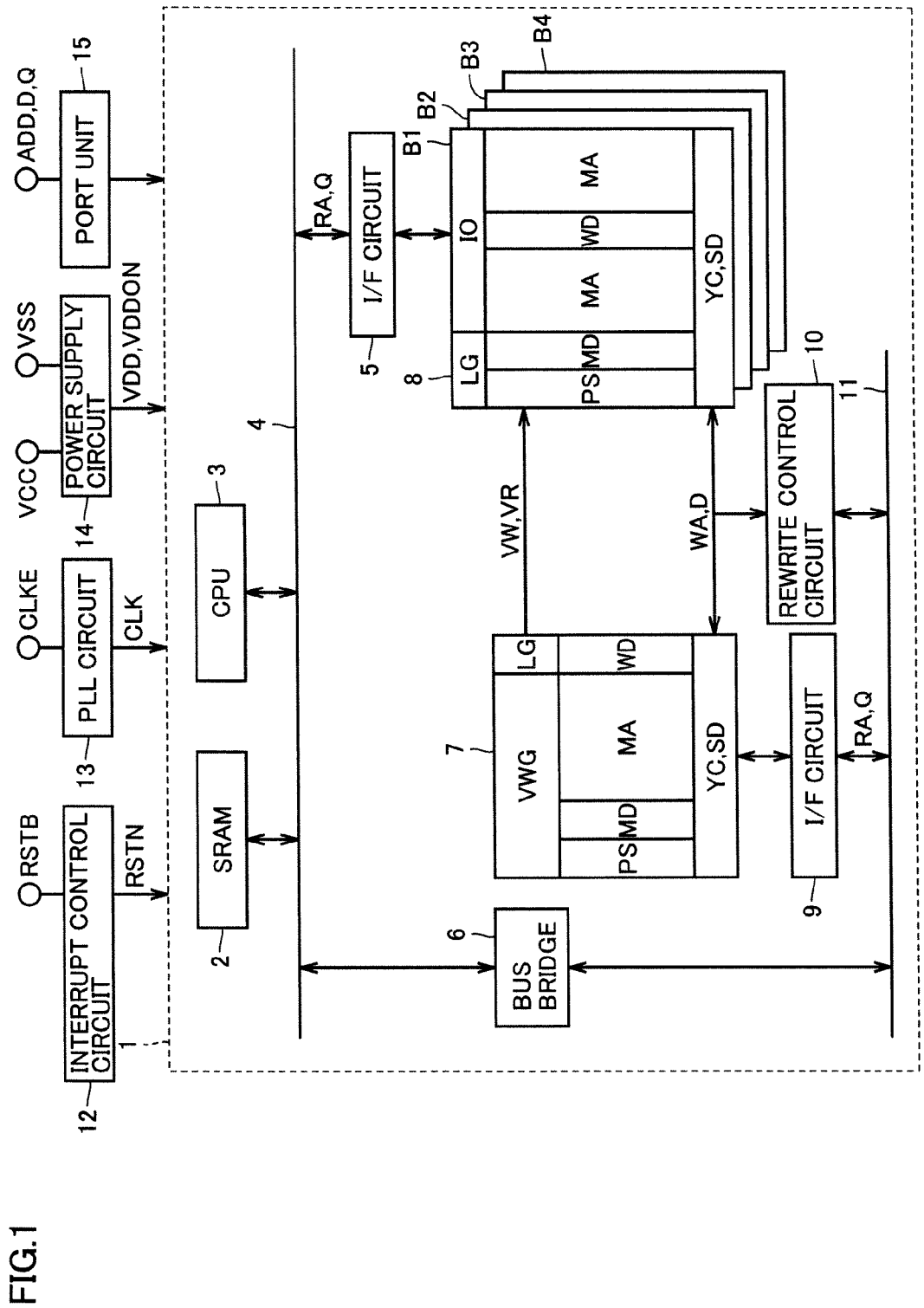
FIG. 1 is a block diagram showing a configuration of a microcontroller chip according to a first embodiment of the present invention.

A microcontroller chip 1 according to a first embodiment of the present invention includes an SRAM (Static Random Access Memory) 2, a CPU (Central Processing Unit) 3, a high-speed CPU bus 4, and I/F (interface) circuits 5, 9, as shown in FIG. 1. Microcontroller chip 1 further includes a bus bridge 6, flash memories 7, 8, a rewrite control circuit 10, and a peripheral bus 11.

SRAM 2 and flash memory 7 store data. Flash memory 8 stores a program. SRAM 2 and CPU 3 are connected to each other through high-speed CPU bus 4. A rewrite address signal WA and a data signal D are applied from CPU 3 to flash memories 7, 8 through high-speed CPU bus 4, bus bridge 6, peripheral bus 11, and rewrite control circuit 10.

A read address signal RA is applied from CPU 3 to flash memory 7 through high-speed CPU bus 4, bus bridge 6, peripheral bus 11, and I/F circuit 9, and a read data signal Q is applied from flash memory 7 to CPU 3 through the path in reverse. Read address signal RA is applied from CPU 3 to flash memory 8 through high-speed CPU bus 4 and I/F circuit 5, and read data signal Q that configures a program is applied from flash memory 8 to CPU 3 through the path in reverse.

Microcontroller chip 1 is connected to an interrupt control circuit 12, a PLL (Phase Locked Loop) circuit 13, a power supply circuit 14, and a port unit 15. Interrupt control circuit 12 applies an internal reset signal RSTN to chip 1 in response to an external reset signal RSTB. PLL circuit 13 generates an internal clock signal CLK synchronized with an external clock signal CLKE and applies the same to chip 1. Power supply circuit 14 generates an internal power supply voltage VDD and a signal VDDON based on an external power supply voltage VCC and an external ground voltage VSS and applies the same to chip 1. Signal VDDON is a signal indicating that internal power supply voltage VDD reaches a predetermined level. Port unit 15 exchanges address signal ADD and data signals D, Q between the outside and chip 1.

Flash memory 7 includes a memory array MA, an MG driver MD, a WL driver WD, an SL driver SD, a Y-based circuit YC, a power supply switch PS, an internal voltage generation circuit VWG, and a logic circuit LG. Flash memory 8 includes a plurality of (four, in the figure) banks B1 to B4. Each bank B includes two memory arrays MA, a WL driver WD, an MG driver MD, an SL driver SD, a Y-based circuit YC, a power supply switch PS, a logic circuit LG, and an input/output buffer 10.

Internal voltage generation circuit VWG generates a rewrite internal voltage VW and a reference voltage VR to supply the same to the entire flash memories 7, 8. Logic circuit LG controls the corresponding entire flash memory 7 or 8. Power supply switch PS distributes rewrite internal voltage VW into the corresponding flash memory 7 or 8.

Memory array MA includes a plurality of memory cells arranged in rows and columns, a plurality of sets of word line WL, memory gate line MG, and source line SL provided corresponding to the respective rows, and bit lines BL provided corresponding to the respective columns. Each memory cell stores a one-bit data signal. A unique address signal is allocated to each memory cell in advance.

MG driver MD, WL driver WD, and SL driver SD drive word line WL, memory gate line MG, and source line SL corresponding to the memory cell selected by an address signal. The Y-based circuit YC selects any one of a plurality of bit lines BL in accordance with an address signal. Input/output buffer IO exchanges read address signal RA and data signal Q between I/F circuit 5 and flash memory 8.

Figure 2:
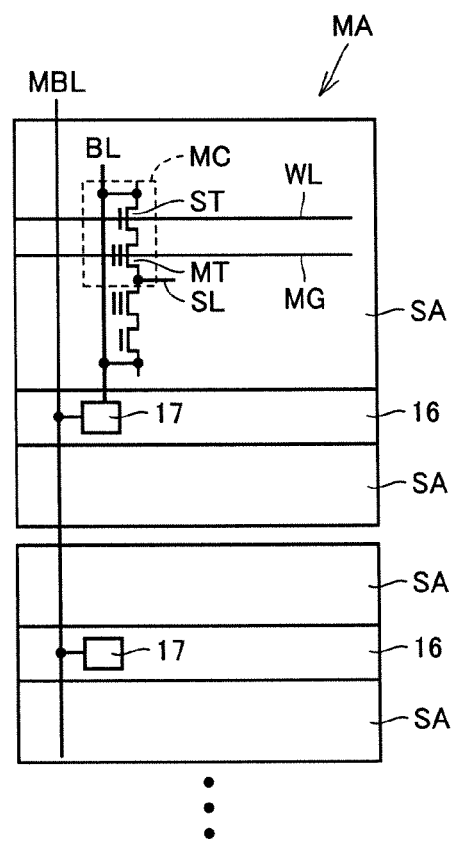
FIG. 2 is a circuit block diagram showing a configuration of a memory array shown in FIG. 1.

FIG. 2 is a circuit block diagram showing a configuration of memory array MA. In FIG. 2, memory array MA is divided into a plurality of sub-arrays SA. A plurality of sub-arrays SA are grouped into twos in advance. A sense amplifier band 16 is arranged between two sub-arrays SA of each group.

Each sub-array SA includes a plurality of memory cells MC arranged in rows and columns, a plurality of sets of word line WL, memory gate line MG, and source line SL corresponding to the respective rows, and bit lines BL provided corresponding to the respective columns. Each memory cell MC includes a select transistor ST and a memory transistor MT connected in series between bit line BL and source line SL. Select transistor ST has the gate connected to word line WL, and memory transistor MT has the gate connected to memory gate line MG.

The threshold voltage of memory transistor MT can be set to one of a high value VTH and a low value VTL by driving word line WL, memory gate line MG, source line SL, and bit line BL. For example, a state in which the threshold voltage of memory transistor MT has high value VTH is associated with a data signal "0", and a state in which the threshold voltage of memory transistor MT has low value VTL is associated with a data signal "1". A one-bit data signal is thus stored in one memory cell MC.

The operation of rewriting the threshold voltage of memory cell MC from high value VTH to low value VTL is called an erase operation. Conversely, the operation of rewriting the threshold voltage of memory cell MC from low value VTL to high value VTH is called a program operation or a write operation.

In a read operation, a predetermined voltage is applied to bit line BL, and word line WL is set to "H" level to render select transistor ST conductive, thereby applying a read voltage between high value VTH and low value VTL to memory gate line MG. When the threshold voltage of memory transistor MT has high value VTH, current smaller than reference current IR flows through memory transistor MT. When the threshold voltage of memory transistor MT has low value VTL, current larger than reference current IR flows through memory transistor MT. Therefore, it can be determined whether the data signal stored in memory cell MC is "0" or "1" by comparing the magnitudes of the current flowing through memory transistor MT and reference current IR.

Sense amplifiers 17 are arranged at a ratio of one in a predetermined number of columns in each sense amplifier band 16. Sense amplifier 17 reads out a data signal from the selected memory cell MC. Main bit lines MBL shared by a plurality of sub-arrays SA are provided at a ratio of one in a predetermined number of columns. Main bit line MBL is connected to the corresponding sense amplifier 17 in each sense amplifier band 16.

Figure 3:
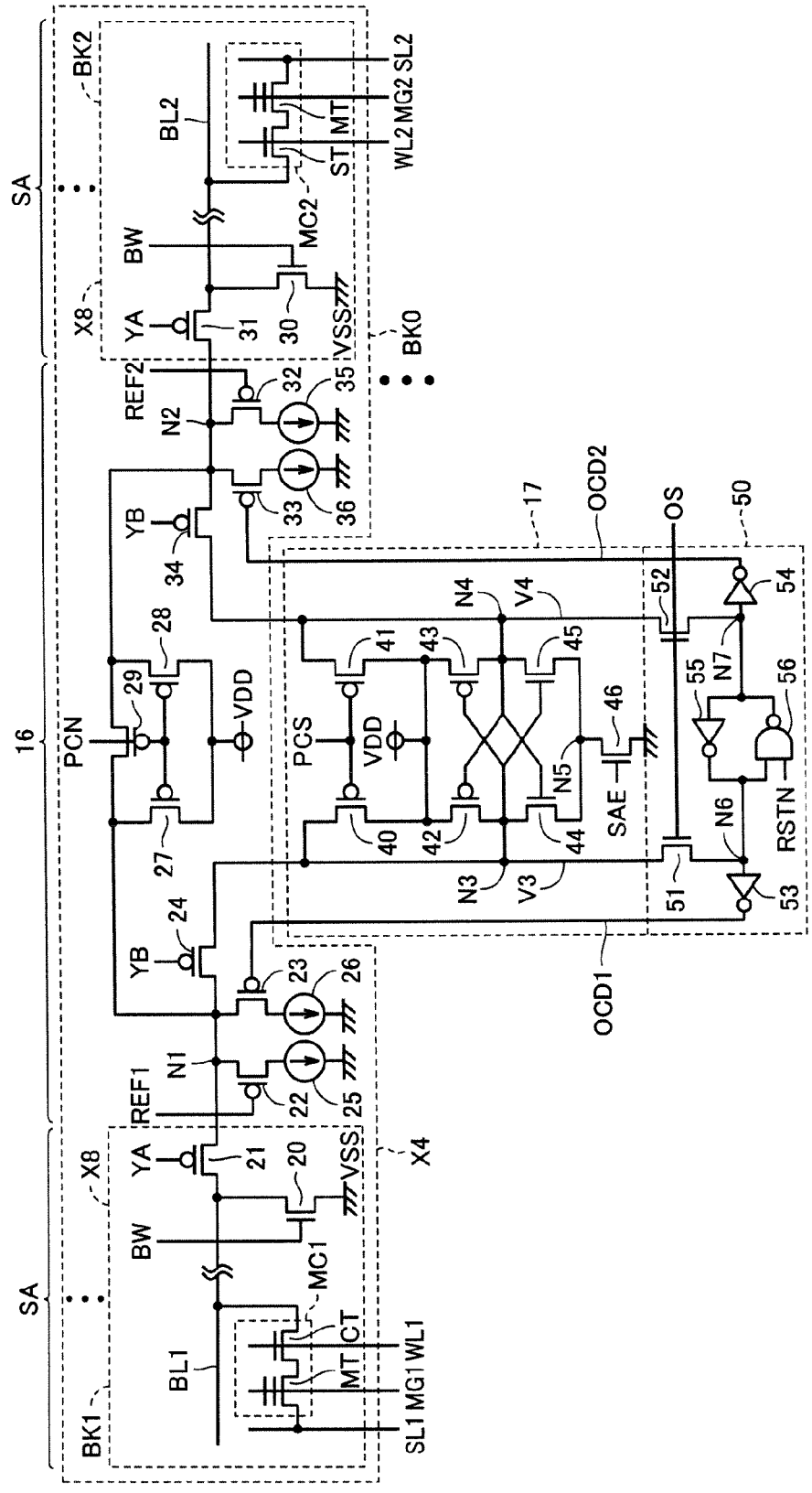
FIG. 3 is a circuit diagram showing a main part of a sub-array and a sense amplifier band shown in FIG. 2.

FIG. 3 is a circuit diagram showing a main part of two sub-arrays SA and one sense amplifier band 16. In FIG. 3, two sub-arrays SA and one sense amplifier band 16 are divided into four blocks BK0. For each of four blocks BK0, one sense amplifier 17 and a register 50 are provided.

Each block BK0 includes eight blocks BK1 belonging to one sub-array SA, eight blocks BK2 belonging to the other sub-array SA, and P-channel MOS transistors 22 to 24, 27 to 29, 30 to 34 and a constant current sources 25, 26, 35, 36.

Each block BK1 includes a plurality of memory cells MC1 corresponding to one column, bit line BL1 corresponding to that column, and word line WL1, memory gate line MG1, and source line SL1 corresponding to each memory cell MC1. In FIG. 3, only one memory cell MC1 is representatively shown. Block BK1 also includes an N-channel MOS transistor 20 and a P-channel MOS transistor 21.

Transistor 20 is connected between bit line BL1 and a ground voltage VSS line and has the gate receiving a signal BW. When signal BW is at "H" level, transistor 20 is rendered conductive, and bit line BL1 is fixed to ground voltage VSS. When signal BW is at "L" level, transistor 20 is rendered non-conductive. Transistor 21 is connected between bit line BL1 and a node N1 and has the gate receiving a signal YA. Signal YA is a signal that selects one bit line BL1 from eight bit lines BL1 belonging to block BK1. When one of eight signals YA is set to "L" level, transistor 21 corresponding to that signal YA is rendered conductive, and bit line BL1 is electrically connected to node N1. When signal YA is set to "H" level, transistor 21 corresponding to that signal YA is rendered non-conductive.

Similarly, each block BK2 includes a plurality of memory cells MC2 associated with one column, bit line BL2 corresponding to that column, and word line WL2, memory gate line MG2, and source line SL2 corresponding to each memory cell MC2. In FIG. 3, only one memory cell MC2 is representatively shown. Block BK2 also includes an N-channel MOS transistor 30 and a P-channel MOS transistor 31.

Transistor 30 is connected between bit line BL2 and the ground voltage VSS line and has the gate receiving a signal BW. When signal BW is at "H" level, transistor 30 is rendered conductive, and bit line BL2 is fixed to ground voltage VSS. When signal BW is at "L" level, transistor 30 is rendered non-conductive. Transistor 31 is connected between bit line BL2 and a node N2 and has the gate receiving signal YA. Signal YA is a signal that selects one bit line BL2 from eight bit lines BL2 belonging to block BK2. When one of eight signals YA is set to "L" level, transistor 31 corresponding to that signal YA is rendered conductive, and bit line BL2 is electrically connected to node N2. When signal YA is set to "H" level, transistor 31 corresponding to that signal YA is rendered non-conductive. One memory cell MC belonging to one of blocks BK1 and BK2 is selected.

P-channel MOS transistor 22 and constant current source 25 are connected in series between node N1 and the ground voltage VSS line. The gate of transistor 22 receives a signal REF1. When signal REF1 is at "L" level, transistor 22 is rendered conductive, so that reference current IR flows from node N1 to the ground voltage VSS line. When signal REF1 is at "H" level, transistor 22 is rendered non-conductive.

P-channel MOS transistor 32 and constant current source 35 are connected in series between node N2 and the ground voltage VSS line. The gate of transistor 32 receives a signal REF2. When signal REF 2 is at "L" level, transistor 32 is rendered conductive, so that reference current IR flows from node N2 to the ground voltage VSS line. When signal REF2 is at "H" level, transistor 32 is rendered non-conductive.

When memory cell MC1 in block BK1 is selected, signal REF1 is set to "H" level, and signal REF2 is set to "L" level, so that the magnitudes of current flowing through memory cell MC1 and reference current IR flowing through constant current source 35 are compared. When memory cell MC2 in block BK2 is selected, signal REF1 is set to "L" level and signal REF2 is set to "H" level, so that the magnitudes of current flowing through memory cell MC2 and reference current IR flowing through constant current source 25 are compared.

P-channel MOS transistor 23 and constant current source 26 are connected in series between node N1 and the ground voltage VSS line. The gate of transistor 23 receives a signal OCD1. When signal OCD1 is at "L" level, transistor 23 is rendered conductive, so that an offset compensating current IOC flows from node N1 to the ground voltage VSS line. When signal OCD1 is at "H" level, transistor 23 is rendered non-conductive.

P-channel MOS transistor 33 and constant current source 36 are connected in series between node N2 and the ground voltage VSS line. The gate of transistor 33 receives a signal OCD2. When signal OCD2 is at "L" level, transistor 33 is rendered conductive, so that offset compensating current IOC flows from node N2 to the ground voltage VSS line. When signal OCD2 is at "H" level, transistor 33 is rendered non-conductive.

One of signals OCD1 and OCD2 is set to "L" level in accordance with the offset voltage of sense amplifier 17. As a result, offset compensating current IOC flows out from one of nodes N1 and N2 to compensate for the offset voltage of sense amplifier 17. This will be described in details later.

P-channel MOS transistor 24 is connected between node N1 and a node N3 of sense amplifier 17 and has the gate receiving a signal YB. P-channel MOS transistor 34 is connected between node N2 and a node N4 of sense amplifier 17 and has the gate receiving signal YB. Signal YB is a signal that selects one of four blocks BK0. When one of four signals YB is set to "L" level, transistors 24, 34 corresponding to that signal YB are rendered conductive, so that nodes N1, N2 are connected to nodes N3, N4 of sense amplifier 17. When signal YB is set to "H" level, transistors 24, 34 corresponding to that signal YB are rendered non-conductive.

P-channel MOS transistor 27 is connected between node N1 and a power supply voltage VDD line. P-channel MOS transistor 28 is connected between node N2 and the power supply line VDD line. P-channel MOS transistor 29 is connected between nodes N1 and N2. The gates of transistors 27 to 29 receive a signal PCN. Signal PCN is prepared corresponding to each of four blocks BK0. When signal PCN is at "L" level, transistors 27 to 29 are rendered conductive, and nodes N1, N2 are precharged to power supply voltage VDD. When signal PCN is at "H" level, transistors 27 to 29 are rendered non-conductive.

Sense amplifier 17 includes P-channel MOS transistors 40 to 43 and N-channel MOS transistors 44 to 46. Transistor 40 is connected between node N3 and the power supply voltage VDD line. Transistor 41 is connected between node N4 and the power supply voltage VDD line. The gates of transistors 40, 41 receive signal PCS. When signal PCS is at "L" level, transistors 40, 41 are rendered conductive, and nodes N3, N4 are precharged to power supply voltage VDD. When signal PCS is at "H" level, transistors 40, 41 are rendered non-conductive.

Transistor 42 is connected between the power supply voltage VDD line and node N3 and has the gate connected to node N4. Transistor 43 is connected between the power supply voltage VDD line and node N4 and has the gate connected to node N3. Transistor 44 is connected between nodes N3 and N5 and has the gate connected to node N4. Transistor 45 is connected between nodes N4 and N5 and has the gate connected to node N3. Transistor 46 is connected between node N5 and the ground voltage VSS line and has the gate receiving a signal SAE.

When signal SAE is set to "H" level with signal PCS set at "H" level, transistor 46 is rendered conductive to activate sense amplifier 17, so that sense amplifier 17 amplifies the potential difference between nodes N3 and N4 to power supply voltage VDD. That is, when the voltage of node N3 is higher than the voltage of node N4, the current driving ability of transistors 42, 45 becomes greater than the current driving ability of transistors 43, 44, so that node N3 is set to power supply voltage VDD and node N4 is set to ground voltage VSS. In other words, when the voltage of node N3 is higher than the voltage of node N4, "H" level and "L" level signals are output to nodes N3 and N4, respectively.

Conversely, when the voltage of node N4 is higher than the voltage of node N3, the current driving ability of transistors 43, 44 becomes greater than the current driving ability of transistors 42, 45, so that node N4 is set to power supply voltage VDD and node N3 is set to ground voltage VSS. In other words, when the voltage of node N4 is higher than the voltage of node N3, "H" level and "L" level signals are output to nodes N4 and N3, respectively. When signal SAE is set to "L" level, transistor 46 is rendered non-conductive to inactivate sense amplifier 17.

Register 50 includes N-channel MOS transistors 51, 52, inverters 53 to 55, and an NAND gate 56. Transistor 51 is connected between node N3 of sense amplifier 17 and a node N6 of register 50 and has the gate receiving a signal OS. Transistor 52 is connected between node N4 of sense amplifier 17 and a node N7 of register 50 and has the gate receiving signal OS. When signal OS is at "H" level, transistors 51, 52 are rendered conductive, so that the voltage of nodes N3, N4 is transmitted to nodes N6, N7. When signal OS is at "L"

level, transistors 51, 52 are rendered conductive, so that nodes N3, N4 are electrically isolated from nodes N6, N7.

Inverter 55 outputs an inversion signal of a signal appearing at node N7 to node N6. NAND gate 56 has one input node connected to node N6 and the other input node receiving a signal RSTN and has the output node connected to node N7. When signal RSTN is at "H" level, NAND gate 56 operates as an inverter, and inverter 55 and NAND gate 56 constitute a latch circuit. This latch circuit holds the signals at nodes N6, N7 before transistors 51, 52 are rendered non-conductive. When signal RSTN is at "L" level, nodes N6 and N7 are fixed to "L" level and "H" level, respectively. Inverter 53 outputs an inversion signal of a signal appearing at node N6, as signal OCD1. Inverter 54 outputs an inversion signal of a signal appearing at node N7, as signal OCD2.

Here, the offset voltage of sense amplifier 17 and the compensation method thereof will be explained. In this flash memory, bit line BL is precharged to power supply voltage VDD before a data signal is read out from memory cell MC. Therefore, a mismatch between the threshold voltages of N-channel MOS transistors 44, 45 of sense amplifier 17 greatly affects the offset voltage. Assuming that the respective threshold voltages of transistors 44 and 45 are VT1 and VT2, respectively, two cases will be examined based on their magnitude relation.

The first case is a case where VT1>VT2. In this case, even when voltage V3 of node N3 and voltage V4 of node N4 are equal, transistor 45 is more likely to be rendered conductive than transistor 44. In an equivalent sense, it can be understood that threshold voltages VT1, VT2 of transistors 44, 45 are set equal and voltage V3 of node N3 is set higher than voltage V4 of node N4 (V3−V4=VT1−VT2). Accordingly, in order to cancel the offset voltage of sense amplifier 17, the discharge speed on the node N3 side can be increased, that is, offset compensating current ICO can be added to the node N3 side.

Specifically, when memory cell MC1 on the node N3 side is selected, memory cell current IC and offset compensating current IOC are fed out from node N3, and reference current IR is fed out from node N4. Conversely, when memory cell MC2 on the node N4 side is selected, reference current IR and offset compensating current IOC are fed out from node N3, and memory cell current IC is fed out from node N4. In this way, the offset voltage of sense amplifier 17 can be compensated for.

The second case is a case where VT1<VT2. In this case, even when voltage V3 of node N3 and voltage V4 of node N4 are equal, transistor 44 is more likely to be rendered conductive than transistor 45. In an equivalent sense, it can be understood that threshold voltages VT1, VT2 of transistors 44, 45 are set equal and voltage V4 of node N4 is set higher than voltage V3 of node N3 (V4−V3=VT2−VT1). Accordingly, in order to cancel the offset voltage of sense amplifier 17, the discharge speed on the node N4 side can be increased, that is, offset compensating current ICO can be added to the node N4 side.

Specifically, when memory cell MC1 on the node N3 side is selected, memory cell current IC is fed out from node N3, and reference current IR and offset compensating current IOC are fed out from node N4. Conversely, when memory cell MC2 on the node N4 side is selected, reference current IR is fed out from node N3, and memory cell current IC and offset compensating current IOC are fed out from node N4. In this way, the offset voltage of sense amplifier 17 can be compensated for.

Provided that memory cell MC1 on the node N3 side is selected, FIG. 4(*a*) is a time chart showing a time change of voltages V3, V4 of nodes N3, N4 in the case where VT1>VT2. FIG. 4(*b*) is a time chart showing a time change of voltages V3, V4 of nodes N3, N4 in the case where VT1<VT2. As a comparative example, a time change of voltages V3, V4 of nodes N3, N4 in the case where VT1=VT2 is also shown. FIGS. 4(*a*) and (*b*) both show a case where memory cell MC1 on the node N3 side and constant current source 35 on the node N4 side are selected.

Here, it is assumed that current flowing through memory cell MC1 storing a data signal "0" is IC0, and current flowing through memory cell MC1 storing a data signal "1" is IC1. V3 (IC0) shows a change of V3 when IC0 is fed out from node N3. V3 (IC1) shows a change of V3 when IC1 is fed out from node N3. V3 (IC0+IOC) shows a change of V3 when IC0+IOC is fed out from node N3. V3 (IC1+IOC) shows a change of V3 when IC1+IOC is fed out from node N3. V4 (IR) shows a change of V4 when IR is fed out from node N4. V4 (IR+IOC) shows a change of V4 when IR+IOC is fed out from node N4.

In FIG. 4(*a*), when offset compensating current IOC is not fed out from node N3, V4 (IR) is in the middle between V3 (IC0) and V3 (IC1). If offset compensating current IOC is fed out from node N3 in order to achieve VT1>VT2, V3 is reduced faster by the amount of IOC. In this way, the offset voltage of sense amplifier 17 can be compensated for.

In FIG. 4(*b*), when offset compensating current IOC is not fed out from node N4, V4 (IR) is in the middle between V3 (IC0) and V3 (IC1). If offset compensating current IOC is fed out from node N4 in order to achieve VT1<VT2, V4 is reduced faster by the amount of IOC. In this way, the offset voltage of sense amplifier 17 can be compensated for.

In order to determine the first case (VT1>VT2) and the second case (VT1<VT2), sense amplifier 17 can be activated after nodes N3, N4 are isolated from nodes N1, N2, and nodes N3, N4 are precharged to the same voltage VDD. As a result, a digital signal indicating the magnitude relation between VT1 and VT2 can be obtained. The digital signal is stored in register 50, and offset compensating current IOC is added to node N1 or N2 in accordance with the digital signal in the subsequent read operation, whereby the offset of sense amplifier 17 can be compensated for.

The amount of offset correction is desirably set to about ½ of the maximum mismatch amount that is decided from the size of transistors 44, 45 and the production process. The reason for this is as follows. When |VT1−VT2| is extremely small, the offset sense result may not be stabilized. If a large correction is then made, the effective offset amount may become greater than before correction.

Based on the basic concept as described above, a specific offset correction operation in the circuit configuration in FIG. 3 will be described. The offset sense operation of the present invention is performed in a period excluding a read operation period. One of preferred periods is a chip initialization period after power-on.

Figure 5:
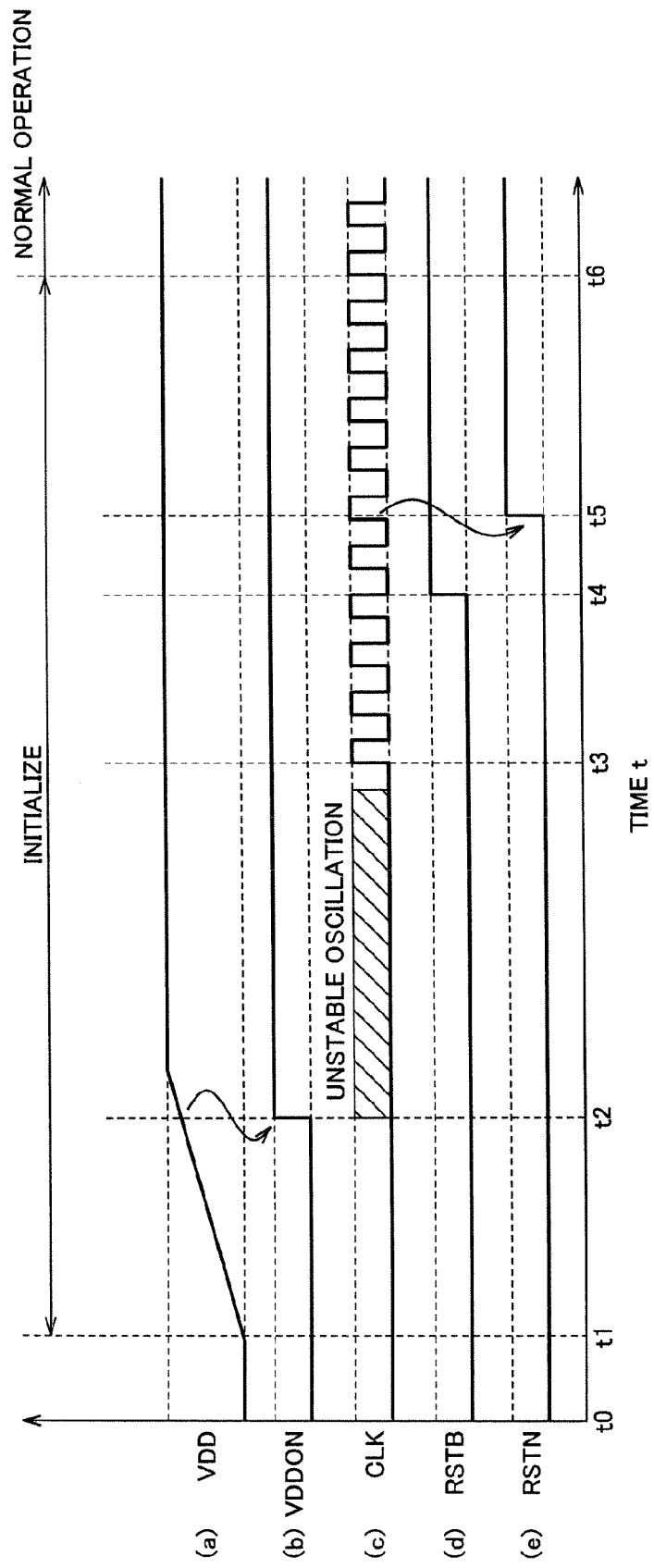
FIG. 5 is a time chart showing a chip initialization sequence after power-on in the microcontroller chip shown in FIG. 1.

FIGS. 5(*a*) to (*e*) are time charts showing a chip initialization sequence after power-on. In the initial state (time t0), internal power supply voltage VDD is 0 V, and a VDD activation completion signal VDDON, internal clock signal CLK, external reset signal RSTB, internal reset signal RSTN are set to "L" level.

When external power supply voltage VCC is applied at a certain time t1, internal power supply voltage VDD starts rising. When internal power supply voltage VDD reaches a predetermined level at time t2, VDD activation completion signal VDDON is raised to "H" level that is an activated level. As a result, the initialization of a partial circuit block inside of chip 1 is started, so that the operation power supply in each circuit rises, for example. PLL circuit 13 also starts operation, and the oscillation operation of PLL circuit 13 is stabilized at time t3, so that the waveform of clock signal CLK is stabilized.

External reset signal RSTB is allowed to keep at "L" level that is an activated level until time t4 later than time t3. Internal reset signal RSTN is raised to "H" level that is an inactivated level at time t5 a few clock cycles after external reset signal RSTB is set to "H" level that is an inactivated level. Subsequently, system initialization (for example, the setting of operation parameters) is performed. At time t6, the entire initialization is completed thereby allowing normal operation. In the following, "initialization" refers to times t5 to t6 in FIG. 5 unless otherwise specified. It is noted that the offset sense operation can be carried out in any other period, as a matter of course, and is not limited to immediately after power-on as long as it can be carried out prior to a read operation.

FIGS. 6(a) to (m) are time charts showing an offset sense operation and a read operation in the circuit shown in FIG. 3. In FIGS. 6(a) to (m), signals YA, YB are fixed to "H" level in the offset sense operation period (times t5 to t6). As a result, transistors 21, 24, 31, 34 are rendered non-conductive, so that sense amplifier 17 is cut off from bit lines BL1, BL2.

Word lines WL1, WL2 are fixed to "L" level, and memory cells MC1, MC2 are set to an inactivated state. Signal BW is fixed to "H" level, and bit lines BL1, BL2 are set to "L" level. Signals REF1, REF2 are both fixed to "H" level to render transistors 22, 32 non-conductive. Signal PCN is fixed to "H" level to render transistors 27 to 29 non-conductive.

In the initial state in the offset sense operation period, signal PCS is set to "L" level to render transistors 40, 41 conductive, and nodes N3, N4 are precharged to power supply voltage VDD. Signal SAE is set to "L" level to render transistor 46 non-conductive, and sense amplifier 17 is inactivated. Signal OS is set to "L" level to render transistors 51, 52 non-conductive. Signal RSTN is set to "L" level, so that NAND gate 56 outputs a "H" level signal.

First, signal RSTN is raised to "H" level. As a result, NAND gate 56 operates as an inverter, and signals OCD1 and OCD2 are initialized to "H" level and "L" level, respectively. Next, signals PCS, SAE are raised to "H" level. As a result, transistors 40, 41 are rendered non-conductive to stop precharge of nodes N3, N4, and transistor 46 is rendered conductive to activate sense amplifier 17.

Figure 6:
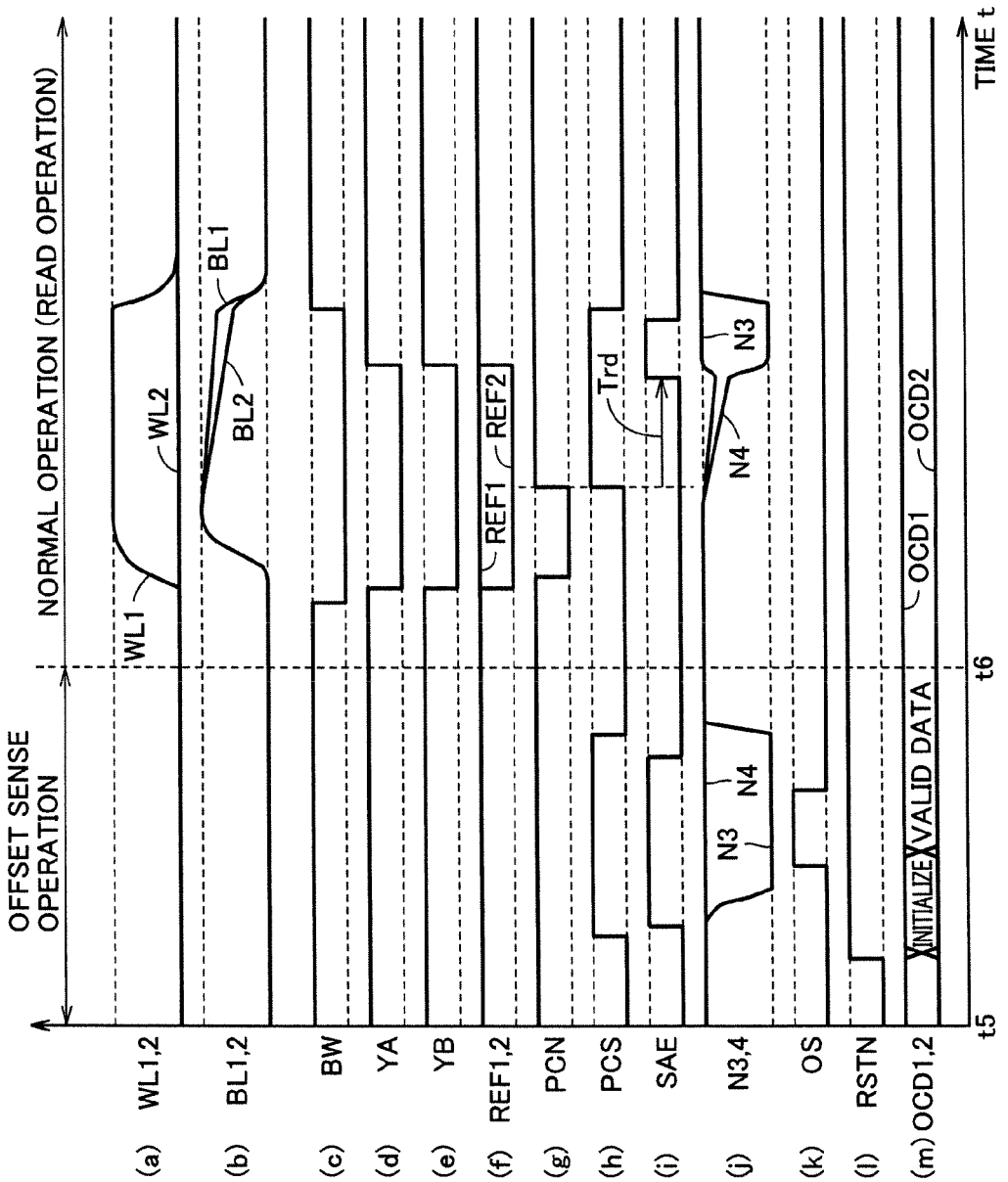
FIG. 6 is a time chart showing an offset sense operation and a read operation of a flash memory shown in FIG. 3.

That is, sense amplifier 17 is activated with voltage V3 of node N3 and voltage V4 of node N4 in the same state, so that the sense result is finalized in accordance with the offset between threshold voltage VT1 of transistor 44 and threshold voltage VT2 of transistor 45. FIG. 6(j) shows a state in which V3 is set to "L" level and V4 is set to "H" level. After a time necessary and sufficient for finalizing the sense result has elapsed, signal OS is raised to "H" level for a predetermined time. As a result, transistors 51, 52 are rendered conductive for a predetermined time, and voltages V3, V4 of nodes N3, N4 are transmitted to nodes N6, N7 and held in register 50.

FIG. 6(m) shows a state in which signals OCD1 and OCD2 are set to "H" level and "L" level, respectively. In this case, transistor 23 is rendered non-conductive, and transistor 33 is rendered conductive, so that offset compensating current IOC flows out from node N2. Next, signals SAE, PCS are successively lowered to "L" level to inactivate sense amplifier 17, and nodes N3, N4 are precharged to internal power supply voltage VDD to complete the sense offset operation.

Normal operation is performed after the sense offset operation is completed. FIGS. 6(a) to (m) show a case where a read operation is performed as normal operation. First, signal BW is lowered to "L" level to render transistors 20, 30 non-conductive. Next, word line WL selected by an address signal is set to "H" level, signals YA, YB are set to "L" level, and signal REF is set to "L" level. Here, word line WL1 in FIG. 3 is set to "H" level, signals YA, YB are set to "L" level, and signal REF2 is set to "L" level. Furthermore, signal PCN is set to "L" level to render transistors 27 to 29 conducive, and bit lines BL1, BL2 are precharged to "H" level.

Next, signals PCN, PCS are both raised to "H" level, and transistors 27 to 29, 40, 41 are rendered non-conductive to stop precharge of bit lines BL1, BL2 and nodes N3, N4. Memory cell current IC flows out from node N3 through memory cell MC1, and reference current IR and offset compensating current IOC flow out from node N4 through constant current sources 35, 36, causing a potential difference between nodes N3 and N4. Here, it is assumed that voltage V3 of node N3 becomes higher than voltage V4 of node N4, and the voltage of bit line BL1 becomes higher than the voltage of bit line BL2.

Signals SAE, YA, YB, REF2 are successively set to "H" level after a predetermined time Trd has elapsed since precharge of nodes N3, N4 is stopped. As a result, transistors 21, 31, 24, 32, 34 are rendered non-conductive to isolate nodes N3, N4 from nodes N1, N2, and transistor 46 is rendered conductive to activate sense amplifier 17, so that the voltage between nodes N3 and N4 is amplified to power supply voltage VDD. Here, it is shown that node N3 is set to "H" level (power supply voltage VDD), and node N4 is set to "L" level (ground voltage VSS). The voltage between nodes N3 and N4 is transmitted to main bit line MBL in FIG. 2 by a driver (not shown).

Next, signal SAE is set to "L" level to inactivate sense amplifier 17, signal PCS is set to "L" level to precharge nodes N3, N4 to "H" level, and signal BW is set to "H" level to set bit lines BL1, BL2 to "L" level. The read operation is thus completed.

In the first embodiment, the polarity of the offset voltage (VT1−VT2) of sense amplifier 17 is read out in the offset sense operation period, and a data signal indicating that polarity is stored into register 50. In a read operation, offset compensating current IOC is added to node N1 or N2 in accordance with the data signal stored in register 50. As a result, the delay time Trd resulting from the offset voltage of sense amplifier 17 is reduced, thereby realizing a high-speed read operation.

The offset sense operation is performed, for example, in the chip initialization period prior to a read operation, so that any additional time for offset cancel does not occur in a read operation period. Therefore, the offset cancel utterly contributes to reduction of the delay time Trd.

The offset cancel is performed digitally, so that the sense result stored in register 50 can be used continuously even after the offset sense operation.

In addition, the additional circuit and the control therefor required for the present invention are simple and have high compatibility when hierarchical sense amplifier bands are arranged in memory array MA in a hierarchical bit line configuration.

Moreover, because of the absence of a conventional switch for switching correction capacitors, there is no restriction on operating voltage resulting from the switch operation.

[Second Embodiment]

Figure 7:
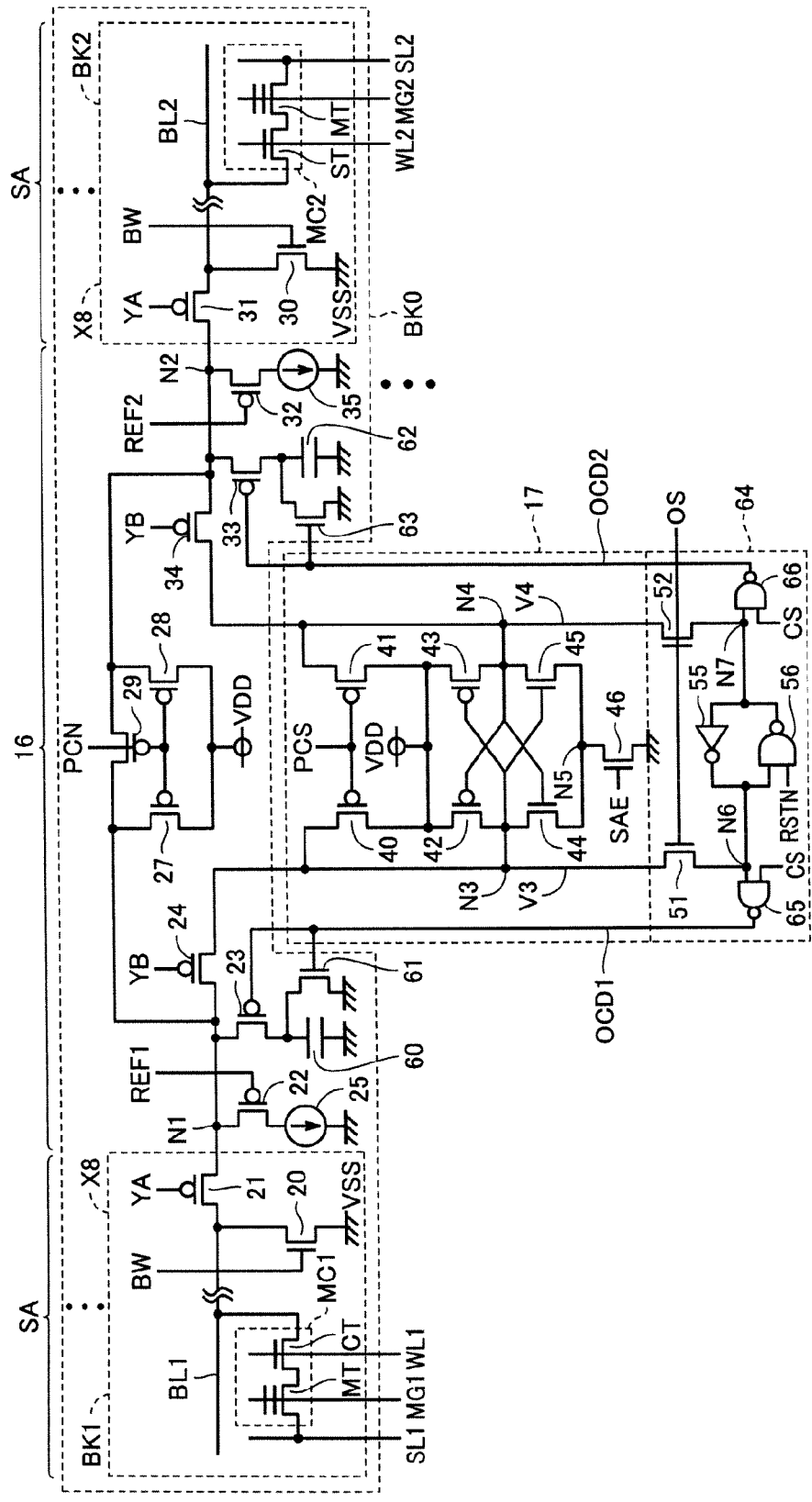
FIG. 7 is a circuit diagram showing a main part of a flash memory included in a microcontroller chip according to a second embodiment of the present invention.

FIG. 7 is a circuit diagram showing a main part of a flash memory included in a microcontroller chip according to a second embodiment of the present invention. This figure is in contrast with FIG. 3. Referring to FIG. 7, this flash memory differs from the flash memory in the first embodiment in that constant current sources 26, 36 are replaced by capacitors 60, 62 and N-channel MOS transistors 61, 63 and that register 50 is replaced by a register 64.

Capacitor 60 is connected between the drain of P-channel MOS transistor 23 and the ground voltage VSS line. N-channel MOS transistor 61 is connected between the drain of P-channel MOS transistor 23 and the ground voltage VSS line and has the gate receiving signal OCD1.

Similarly, capacitor 62 is connected between the drain of P-channel MOS transistor 33 and the ground voltage VSS line. N-channel MOS transistor 63 is connected between the drain of P-channel MOS transistor 33 and the ground voltage VSS line and has the gate receiving signal OCD2.

Register 64 differs from register 50 in that inverters 53, 54 are replaced by NAND gates 65, 66. NAND gate 65 has one input node connected to node N6 and the other input node receiving signal CS and outputs signal OCD1. NAND gate 66 has one input node connected to node N7 and the other input node receiving signal CS and outputs signal OCD2.

In a read operation, signal CS is set to "H" level for a predetermined time with transistors 21, 24 rendered conductive, after bit lines BL1, BL2 are precharged to power supply voltage VDD. When signal CS is set to "H" level, NAND gate 65 operates as an inverter for a signal appearing at node N6, and NAND gate 66 operates as an inverter for a signal appearing at node N7, so that register 64 has the same configuration as register 50. When signal CS is set to "H" level, one of signals OCD1, OCD2 is set to "H" level, and the other signal is set to "L" level. When signal CS is set at "L" level, signals OCD1, OCD2 are both set to "H" level.

When signal OCD1 is at "H" level, transistor 23 is rendered non-conductive, and transistor 61 is rendered conductive, so that the terminal-to-terminal voltage of capacitor 60 is reset to 0 V. When signal OCD1 is set to "L" level with transistors 21, 24 rendered conductive after bit line BL1 is precharged to power supply voltage VDD, transistor 23 is rendered conductive, and transistor 61 is rendered non-conductive. As a result, electric charge of bit line BL1 is distributed to capacitor 60 to reduce voltage V3 of node N3. This is equivalent to that constant current source 26 is connected to node N1 to feed offset compensating current IOC from node N1 in the case where VT1>VT2.

When signal OCD2 is at "H" level, transistor 33 is rendered non-conductive, and transistor 63 is rendered conductive, so that the terminal-to-terminal voltage of capacitor 62 is reset to 0 V. When signal OCD2 is set to "L" level with transistors 31, 34 rendered conductive after bit line BL2 is precharged to power supply voltage VDD, transistor 33 is rendered conductive, and transistor 63 is rendered non-conductive. As a result, electric charge of bit line BL2 is distributed to capacitor 62 to reduce voltage V4 of node N4. This is equivalent to that constant current source 33 is connected to node N2 to feed offset compensating current IOC from node N2 in the case where VT1<VT2.

Given that the capacitance value of capacitor 60 is Coc, and the capacitance value of bit line BL1 is Cb1, when signal OCD1 is lowered from "H" level to "L" level, the voltage of bit line BL1 is reduced by Coc×VDD/(Cb1+Coc). Similarly, given that the capacitance value of capacitor 62 is Coc, and the capacitance value of bit line BL2 is Cb1, when signal OCD2 is lowered from "H" level to "L" level, the voltage of bit line BL2 is reduced by Coc×VDD/(Cb1+Coc). Capacitance value Coc is set in accordance with the offset voltage to compensate for.

The time required for redistribution of electric charge is generally short enough relative to Trd and does not increase Trd nor largely reduce the offset cancel effect. A temporary increase of parasitic capacitance due to the addition of capacitors 60, 62 has little effect.

Figure 8:
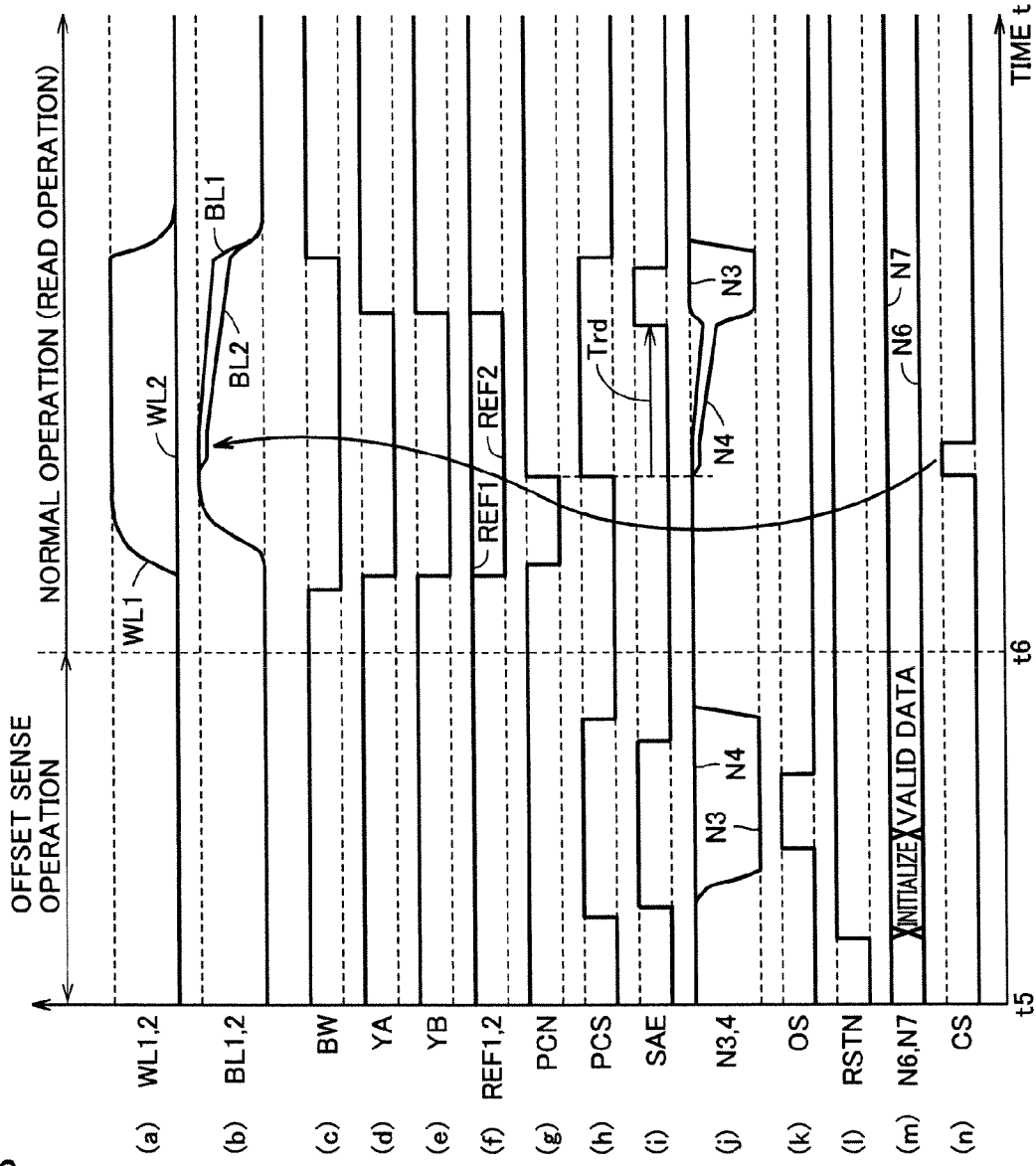
FIG. 8 is a time chart showing an offset sense operation and a read operation of the flash memory shown in FIG. 7.

FIGS. 8(a) to (n) are time charts showing an offset sense operation and a read operation of the flash memory shown in FIG. 7. These figures are in contrast with FIGS. 6(a) to (m). In this flash memory, an offset sense operation is performed in times t5 to t6. As shown in FIG. 8(m), the sense result is held at nodes N6, N7 of register 64. For a period during which signal CS shown in FIG. 8(n) is set at "L" level, signals OCD1, OCD2 are both set to "H" level.

In a read operation, after signals PCN, PCS are raised to "H" level to complete the bit line precharge operation, as shown in FIG. 8(n), signal CS is set to "H" level for a predetermined time. When signal CS is set to "H" level, one of signals OCD1, OCD2 is set to "L" level. FIGS. 8(a) to (n) show the state in which signal OCD2 is set to "L" level. When signal OCD2 is set to "L" level, transistor 63 is rendered non-conductive, and transistor 33 is rendered conductive, so that electric charge of bit line BL2 is distributed to capacitor 62 to reduce the voltage of bit line BL2. As a result, the offset voltage of sense amplifier 17 is compensated for. The other configuration and operation is the same as in the first embodiment, and therefore, a description thereof will not be repeated.

The second embodiment also achieves the same effects as in the first embodiment. It is noted that the layout flexibility may be enhanced because capacitors 60, 62 are provided in place of constant current sources 26, 36. Specifically, in constant current sources 26, 36, transistors of a particular size have to be used in view of preventing characteristic variations. By contrast, with capacitors 60, 62, there is not size restriction as long as there is no large parasitic resistance even when those capacitors are configured with transistors. In addition, capacitance between metal wirings can be used to prevent an increase of the underlying area.

[Third Embodiment]

Figure 9:
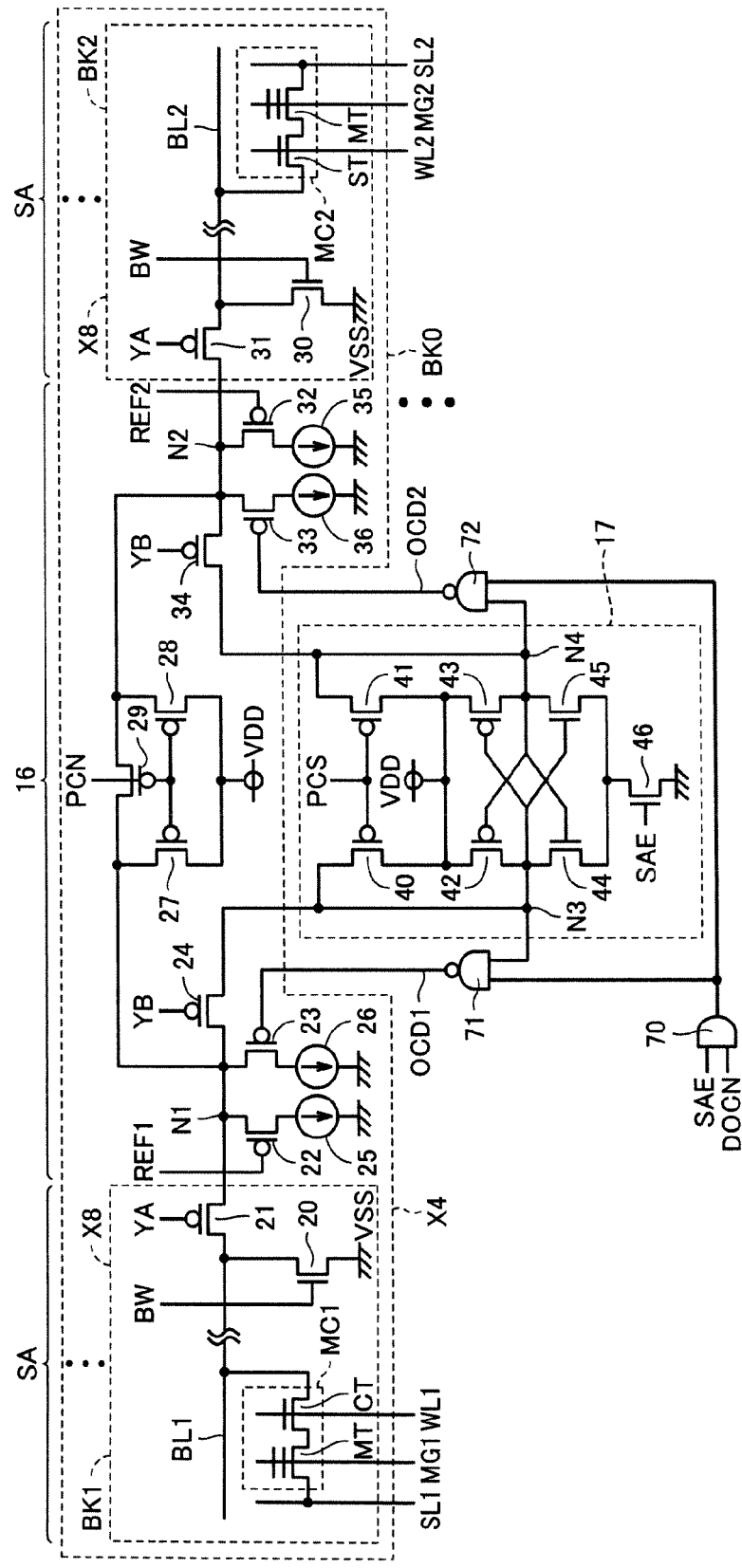
FIG. 9 is a circuit diagram showing a main part of a flash memory included in a microcontroller chip according to a third embodiment of the present invention.

FIG. 9 is a circuit diagram showing a main part of a flash memory included in a microcontroller chip according to a third embodiment of the present invention. This figure is in contrast with FIG. 3. Referring to FIG. 9, this flash memory differs from the flash memory in the first embodiment in that register 50 is replaced by an AND gate 70 and NAND gates 71, 72.

AND gate 70 outputs an AND signal of signal SAE and signal DOCN. NAND gate 71 receives an output signal of AND gate 70 and a signal appearing at node N3 and outputs signal OCD1. NAND gate 72 receives an output signal of AND gate 70 and a signal appearing at node N4 and outputs signal OCD2.

When signals SAE, DOCN are both "H" level, NAND gate 71 operates as an inverter for a signal appearing at node N3, and NAND gate 72 operates as an inverter for a signal appearing at node N4. In this case, an inversion signal of a signal appearing at node N3 is applied as signal OCD1 to the gate of transistor 23, and an inversion signal of a single appearing at node N4 is applied as signal OCD2 to the gate of transistor 33.

That is, in this flash memory, an offset sense operation is carried out immediately before each read operation, and the offset information is held in sense amplifier 17, rather than carrying out an offset sense operation beforehand and storing the offset information into register 50. In other words, an offset sense operation is carried out immediately after each read operation, and the offset information is held in sense amplifier 17 until the next read operation.

FIGS. 10(a) to (k) are time charts showing an offset sense operation and a read operation of the flash memory shown in FIG. 9. In FIGS. 10(a) to (k), signals YA, YB are fixed to "H" level in an idle period (times t0 to t1). As a result, transistors 21, 24, 31, 34 are rendered conductive, and sense amplifier 17 is cut off from bit lines BL1, BL2.

Word lines WL1, WL2 are fixed to "L" level, and memory cells MC1, MC2 are brought into an inactivated state. Signal BW is fixed to "H" level, and bit lines BL1, BL2 are set to "L" level. Signals REF1, REF2 are both fixed to "H" level to render transistors 22, 32 conductive. Signal PCN is fixed to "H" level to render transistors 27 to 29 non-conductive.

In the initial state in the idle period, signal PCS is set to "L" level to render transistors 40, 41 conductive, and nodes N3, N4 are precharged to power supply voltage VDD. Signal SAE is set to "L" level to render transistor 46 non-conductive, so that sense amplifier 17 is inactivated. Signal DOCN is kept at "H" level. Signals OCD1, OCD2 are both set to "H" level to render transistors 23, 33 non-conductive.

Figure 10:
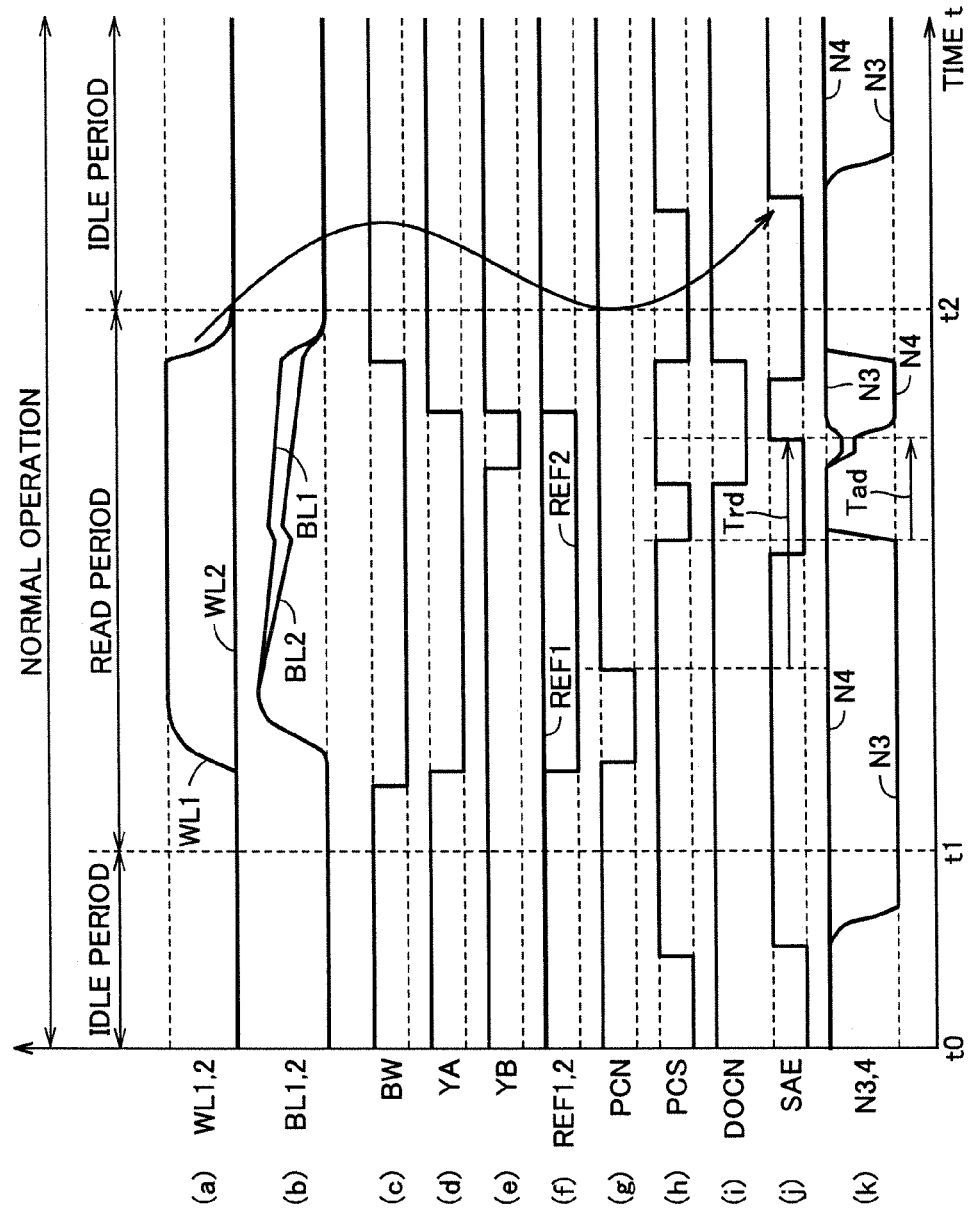
FIG. 10 is a time chart showing an offset sense operation and a read operation of the flash memory shown in FIG. 9.

Next, signals PCS, SAE are raised to "H" level. As a result, transistors 40, 41 are rendered non-conductive to stop precharge of nodes N3, N4, and transistor 46 is rendered conductive to active sense amplifier 17. That is, sense amplifier 17 is activated with voltage V3 of node N3 and voltage V4 of node N4 in the same state, and the sense result is finalized in accordance with the offset between threshold voltage VT1 of transistor 44 and threshold voltage VT2 of transistor 45. FIG. 10(k) shows a state in which node N3 is set to "L" level and node N4 is set to "H" level. Signals appearing at nodes N3, N4 are inverted by NAND gates 71, 72 to become signals OCD1, OCD2.

Here, it is assumed that signals OCD1 and OCD2 are set to "H" level and "L" level, respectively. In this case, transistor 23 is rendered non-conductive, and transistor 33 is rendered conductive, so that offset compensating current IOC flows out from node N2. Signals SAE, PCS are kept at "H" level even after the end of the idle period.

A read operation is started after the end of the idle period (time t1). First, signal BW is lowered to "L" level to render transistors 20, 30 non-conductive. Next, word line WL selected by an address signal is set to "H" level, signals YA, YB are set to "L" level, and signal REF is set to "L" level. Here, it is assumed that control gate WL1 in FIG. 3 is set to "H" level, signals YA, YB are set to "L" level, and signal REF2 is set to "L" level. Signal PCN is set to "L" level to render transistors 27 to 29 conductive, and bit lines BL1, BL2 are precharged to "H" level.

Next, signal PCN is raised to "H" level, and transistors 27 to 29 are rendered non-conductive to stop precharge of bit lines BL1, BL2. Memory cell current IC flows out from bit line BL1 through memory cell MC1, and reference current IR and offset compensating current IOC flow out from bit line BL2 through constant current sources 35, 36, causing a potential difference between bit lines BL1 and BL2. Here, it is assumed that the voltage of bit line BL1 becomes higher than the voltage of bit line BL2.

Next, signal SAE is set to "L" level to inactivate sense amplifier 17, and signals OCD1, OCD2 are both set to "H" level to render transistors 23, 33 non-conductive. Signal PCS is set to "L" level to precharge nodes N3, N4 to "H" level. Signal PCS is then raised to "H" level to stop precharge of nodes N3, N4. Signal DOCN is set to "L" level to render transistors 23, 33 non-conductive. Signal YB is then set to "L" level. As a result, transistors 24, 34 are rendered conductive, so that the read voltages that reflect the offset correction on bit lines BL1 and BL2 are transmitted to nodes N3 and N4, respectively.

Signal SAE is set to "H" level after a predetermined time Trd has elapsed since precharge of bit lines BL1, BL2 is completed. As a result, transistor 46 is rendered conductive to activate sense amplifier 17, so that the voltage between nodes N3 and N4 is amplified to power supply voltage VDD. Here, it is shown that node N3 is set to "H" level (power supply voltage VDD) and node N4 is set to "L" level (ground voltage VSS). The voltage between nodes N3 and N4 is transmitted to main bit line MBL in FIG. 2 by a driver (not shown).

Next, signals YA, YB, REF1, REF2 are set to "H" level to render transistors 21 to 24, 31 to 34 non-conductive, so that sense amplifier 17 is cut off from nodes N1, N2. Signal SAE is then set to "L" level to inactivate sense amplifier 17, signal PCS is set to "L" level to precharge nodes N3, N4 to "H" level, and signal BW is set to "H" level to set bit lines BL1, BL2 to "L" level. The read operation is thus completed.

In the third embodiment, when compared with the first embodiment, the offset cancel time Tad is added to a read period, so that the Trd reduction effect by offset cancel is cancelled out accordingly. The effect is therefore exerted in a case where the Trd/Tad ratio is high, that is, a case where the Cb1/IC ratio is high (the capacitance value of bit line BL is relatively large, and cell current is not ensured enough). Conversely, in view of area, the circuit area can be reduced because there is no need for providing register 50 for each sense amplifier 17.

[Fourth Embodiment]

Figure 11:
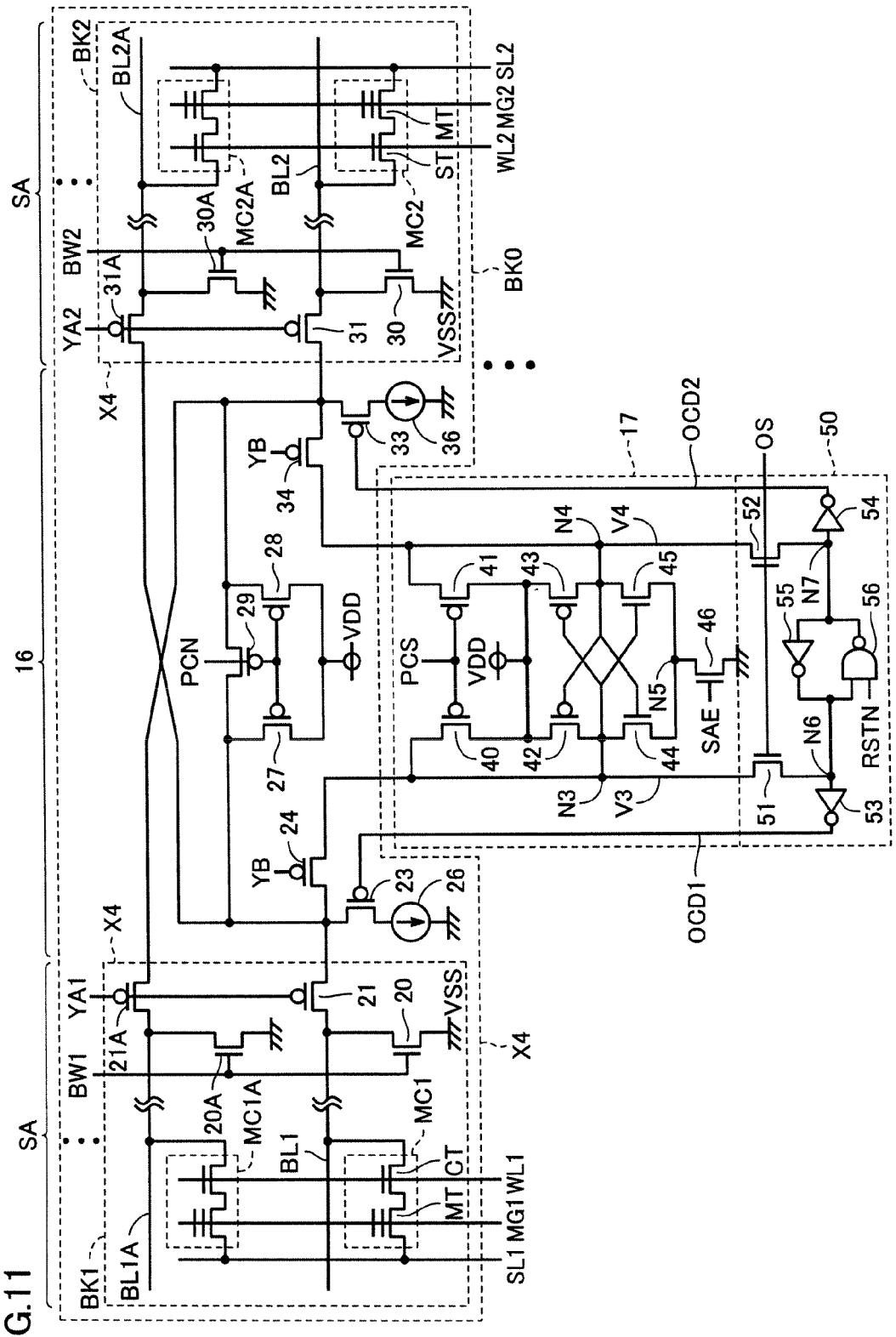
FIG. 11 is a circuit diagram showing a main part of a flash memory included in a microcontroller chip according to a fourth embodiment of the present invention.
Figure 12:
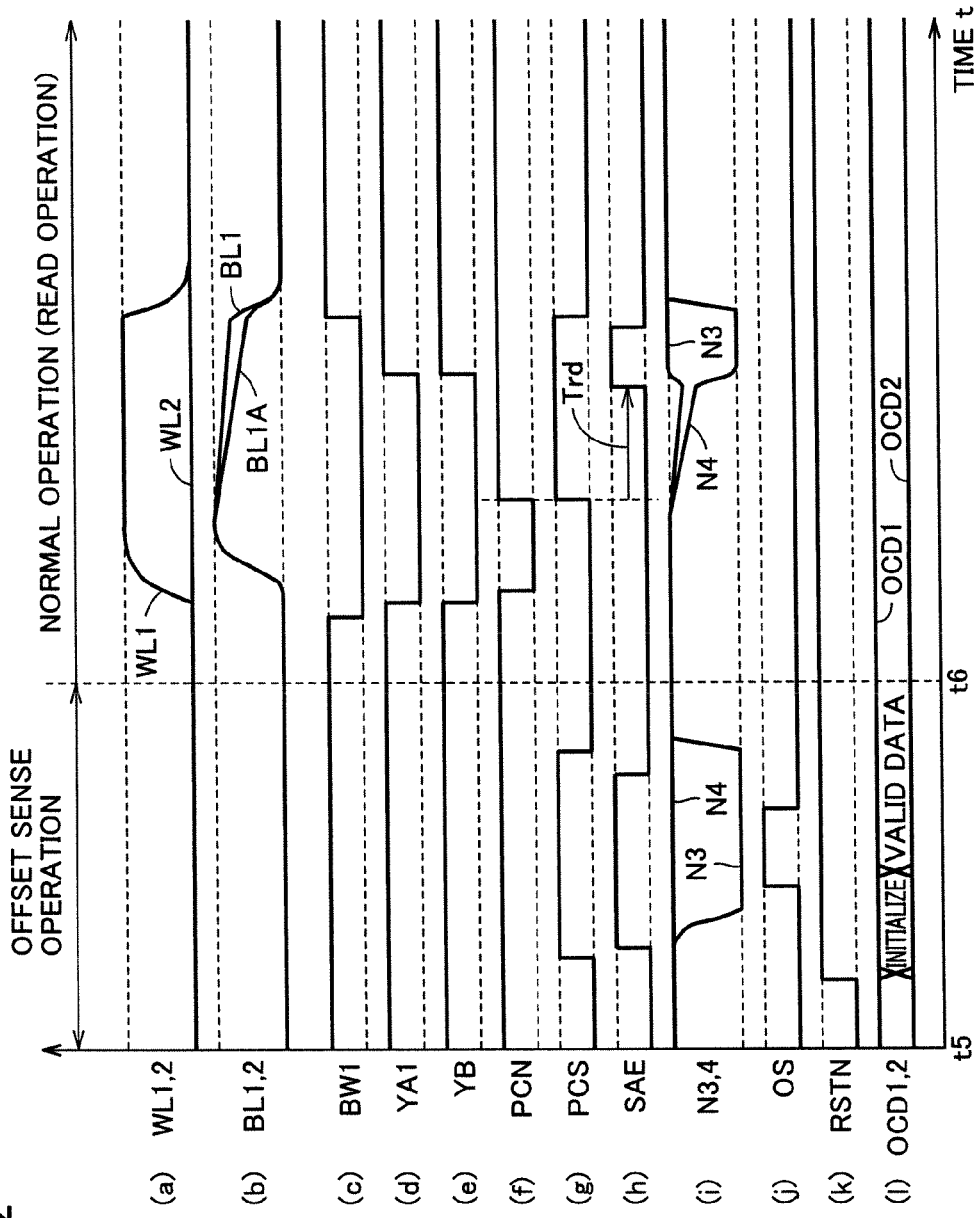
FIG. 12 is a time chart showing an offset sense operation and a read operation of the flash memory shown in FIG. 11.

FIG. 11 is a circuit diagram showing a main part of a flash memory included in a microcontroller chip according to a fourth embodiment of the present invention. This figure is in contrast with FIG. 3. Referring to FIG. 11, this flash memory differs from the flash memory according to the first embodiment in that a complementary cell configuration is employed, in which two memory cells MC1, MC1A or MC2, MC2A store a one-bit data signal. Transistors 22, 32 and constant current sources 25, 35 for feeding reference current IR are removed.

Specifically, in FIG. 11, two sub-arrays SA and one sense amplifier band 16 are divided into four blocks BK0. One sense amplifier 17 and register 50 are provided for each of four blocks BK0. Each block BK0 includes four blocks BK1 belonging to one sub-array SA, four blocks BK2 belonging to the other sub-array SA, and P-channel MOS transistors 23, 24, 27 to 29, 30, 31, 33, 34, and constant current sources 25, 35. Each block BK1 includes a plurality of memory cells MC1 corresponding to one column, bit line BL1 corresponding to that column, a plurality of memory cells MC1A corresponding to another column, and bit line BL1A corresponding to that column. Two memory cells MC1, MC1A in the same row make a pair. A one-bit data signal is stored in memory cells MC1, MC1A. Specifically, one of memory cells MC1, MC1A is programmed, and the other memory cell is erased. This enables a data signal to be stored accurately.

Each block BK1 also includes word line WL1, memory gate line MG1, and source line SL1 corresponding to each memory cell row. In FIG. 11, only a pair of memory cells MC1 and MC is representatively shown. Block BK1 also includes N-channel MOS transistors 20, 20A and P-channel MOS transistors 21, 21A.

Transistor 20 is connected between bit line BL1 and the ground voltage VSS line and has the gate receiving signal BW1. Transistor 20A is connected between bit line BL and the ground voltage VSS line and has the gate receiving signal BW1. When signal BW1 is at "H" level, transistors 20, 20A are rendered conductive, and bit lines BL1, BL1A are fixed to ground voltage VSS. When signal BW1 is at "L" level, transistors 20, 20A are rendered non-conductive.

Transistor 21 is connected between bit line BL1 and node N1 and has the gate receiving signal YA1. Transistor 21A is connected between bit line BL1A and node N2 and has the gate receiving signal YA1. Signal YA1 is a signal that selects one pair of bit lines BL1 and BL1A from four pairs of bit lines BL1 and BL1A belonging to block BK1. When one of four signals YA1 is set to "L" level, transistors 21, 21A corresponding to that signal YA1 are rendered conductive, and bit lines BL1 and BL1A are electrically connected to nodes N1 and N2, respectively. When signal YA1 is set to "H" level, transistors 21, 21A corresponding to that signal YA1 are rendered non-conductive.

Similarly, each block BK2 includes a plurality of memory cells MC2 corresponding to one column, bit line BL2 corresponding to that column, a plurality of memory cells MC2A corresponding to another column, and bit line BL2A corresponding to that column. Two memory cells MC1, MC1A in the same row make a pair. A one-bit data signal is stored in memory cells MC2, MC2A. Specifically, one of memory cells MC2, MC2A is programmed, and the other memory cell is erased. This enables a data signal to be stored accurately.

Each block BK2 also includes word line WL2, memory gate line MG2, and source line SL2 corresponding to each memory cell row. In FIG. 11, only a pair of memory cells MC2 and MC2A is representatively shown. Block BK2 also includes N-channel MOS transistors 30, 30A and P-channel MOS transistors 31, 31A.

Transistor 30 is connected between bit line BL1 and the ground voltage VSS line and has the gate receiving signal BW2. Transistor 30A is connected between bit line BL2A and the ground voltage VSS line and has the gate receiving signal BW2. When signal BW2 is at "H" level, transistors 30, 30A are rendered conductive, and bit lines BL2, BL2A are fixed to ground voltage VSS. When signal BW2 is at "L" level, transistors 30, 30A are rendered non-conductive.

Transistor 31 is connected between bit line BL2 and node N2 and has the gate receiving signal YA2. Transistor 31A is connected between bit line BL2A and node N1 and has the gate receiving signal YA2. Signal YA2 is a signal that selects one pair of bit lines BL2 and BL2A from four pairs of bit lines BL2 and BL2A belonging to block BK2. When one of four signals YA2 is set to "L" level, transistors 31, 31A corresponding to that signal YA2 are rendered conductive, and bit lines BL2 and BL2A are electrically connected to nodes N2 and N1, respectively. When signal YA2 is set to "H" level, transistors 31, 31A corresponding to that signal YA are rendered non-conductive. A pair of memory cells MC belonging to one block BK of blocks BK1 and BK2 is selected.

FIGS. 12(a) to (l) are time charts showing an offset sense operation and a read operation of the flash memory shown in FIG. 11. These figures are in contrast with FIGS. 6(a) to (m). FIGS. 12(a) to (l) show a case where a pair of memory cells MC1, MC1A is selected. In this case, the magnitudes of current flowing through memory cell MC1 and current flowing through memory cell MC are compared by sense amplifier 17, and a data signal stored in memory cells MC1, MC1A is read out based on the result of comparison. Reference current IR is not necessary. The other configuration and operation is the same as in the first embodiment, and therefore, a description thereof will not be repeated.

The fourth embodiment also achieves the same effects as in the first embodiment. In the complementary cell configuration, information is stored as a current difference between memory cells, thereby stably ensuring a read potential difference against temperature or voltage variations. This configuration is therefore used in a case where extremely high reliability is required. Accordingly, high reliability and high-speed read operation are achieved at the same time.

[Fifth Embodiment]

Figure 13:
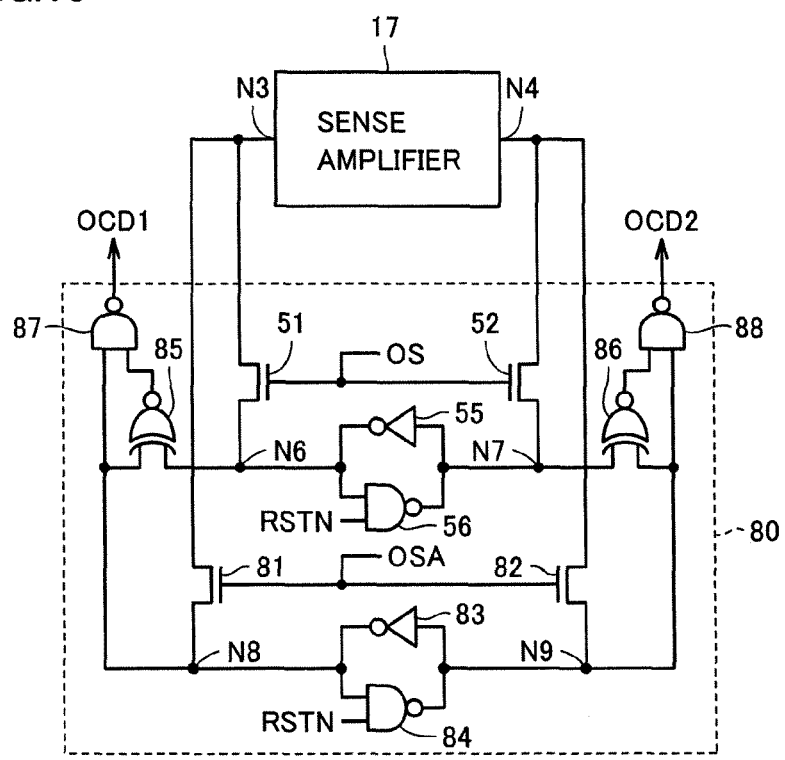
FIG. 13 is a circuit diagram showing a main part of a flash memory included in a microcontroller chip according to a fifth embodiment of the present invention.

FIG. 13 is a circuit diagram showing a main part of a flash memory included in a microcontroller chip according to a fifth embodiment of the present invention. This figure is in contrast with FIG. 3. Referring to FIG. 13, this flash memory differs from the flash memory according to the first embodiment in that register 50 is replaced by a register 80.

Register 80 differs from register 50 in that inverters 53, 54 are removed and that N-channel MOS transistors 81, 82, an inverter 83, NAND gates 84, 87, 88, and EX-NOR gates 85, 86 are added.

Transistor 81 is connected between nodes N3 and N8 and has the gate receiving a signal OSA. Transistor 82 is connected between nodes N4 and N9 and has the gate receiving signal OSA. When signal OSA is at "H" level, transistors 81, 82 are rendered conductive, so that the voltages of nodes N3, N4 are transmitted to nodes N8, N9. When signal OSA is at "L" level, transistors 81, 82 are rendered non-conductive, so that nodes N3, N4 are electrically cut off from nodes N8, N9.

Inverter 83 outputs an inversion signal of a signal appearing at node N9 to node N8. NAND gate 84 has one input node connected to node N8 and the other input node receiving signal RSTN and has the output node connected to node N9. When signal RSTN is at "H" level, NAND gate 84 operates as an inverter, and inverter 83 and NAND gate 84 constitute a latch circuit. This latch circuit holds the signals at nodes N8, N9 before transistors 81, 82 are rendered non-conductive. When signal RSTN is at "L" level, nodes N8 and N9 are fixed to "L" level and "H" level, respectively.

EX-NOR gate 85 outputs an "H" level signal when the logic level of a signal appearing at node N6 and the logic level of a signal appearing at node N8 agree, and outputs an "L" level signal if they do not agree. NAND gate 87 receives an output signal of EX-NOR gate 85 and a signal appearing at node N8 and outputs signal OCD1.

When the output signal of EX-OR gate 85 is at "H" level, NAND gate 87 operates as an inverter, so that an inversion signal of a signal appearing at node N8 becomes signal OCD1. When the output signal of EX-OR gate 85 is at "L" level, signal OCD1 that is the output signal of NAND gate 87 is fixed to "H" level.

Similarly, EX-NOR gate 86 outputs an "H" level signal when the logic level of a signal appearing at node N7 and the logic level of a signal appearing at node N9 agree, and outputs an "L" level signal if they do not agree. NAND gate 88 receives an output signal of EX-NOR gate 86 and a signal appearing at node N9 and outputs signal OCD2.

When the output signal of EX-OR gate 86 is at "H" level, NAND gate 88 operates as an inverter, so that an inversion signal of a signal appearing at node N9 becomes signal OCD2. When the output signal of EX-OR gate 86 is at "L" level, signal OCD2 that is the output signal of NAND gate 88 is fixed to "H" level.

Signals OS and OSA are set to "H" level at different timings each for a predetermined time, and the voltages of nodes N3, N4 are latched at nodes N6, N7 and nodes N8, N9 at different timings. When the signals latched at nodes N6, N7 agree with the signals latched at nodes N8, N9, inversion signals of the signals latched at nodes N8, N9 become signals OCD1, OCD2. When the signals latched at nodes N6, N7 do not agree with the signals latched at nodes N8, N9, signals OCD1, OCD2 are both fixed to "H" level.

A plurality of latch circuits are provided for the following reason. When the difference |VT1−VT2| between threshold voltages VT1 and VT2 of transistors 44 and 45 is small, offset correction is not performed in order to enhance the correction effect. In other words, when |VT1−VT2| is small, the result of an offset sense operation may not be stabilized. If a large correction is then made, the offset amount may be deteriorated more in the opposite direction than before correction. Therefore, two kinds of sense times in offset cancel, namely, long and short ones, are prepared. The operation is then performed with the short sense time for a first time and with the long sense time for a second time. If the two results are different, it is determined that |VT1−VT2| is small, and correction is not made. By doing so, offset compensating current IOC can be set larger than in the first embodiment, thereby improving the Trd reduction effect.

Figure 14:
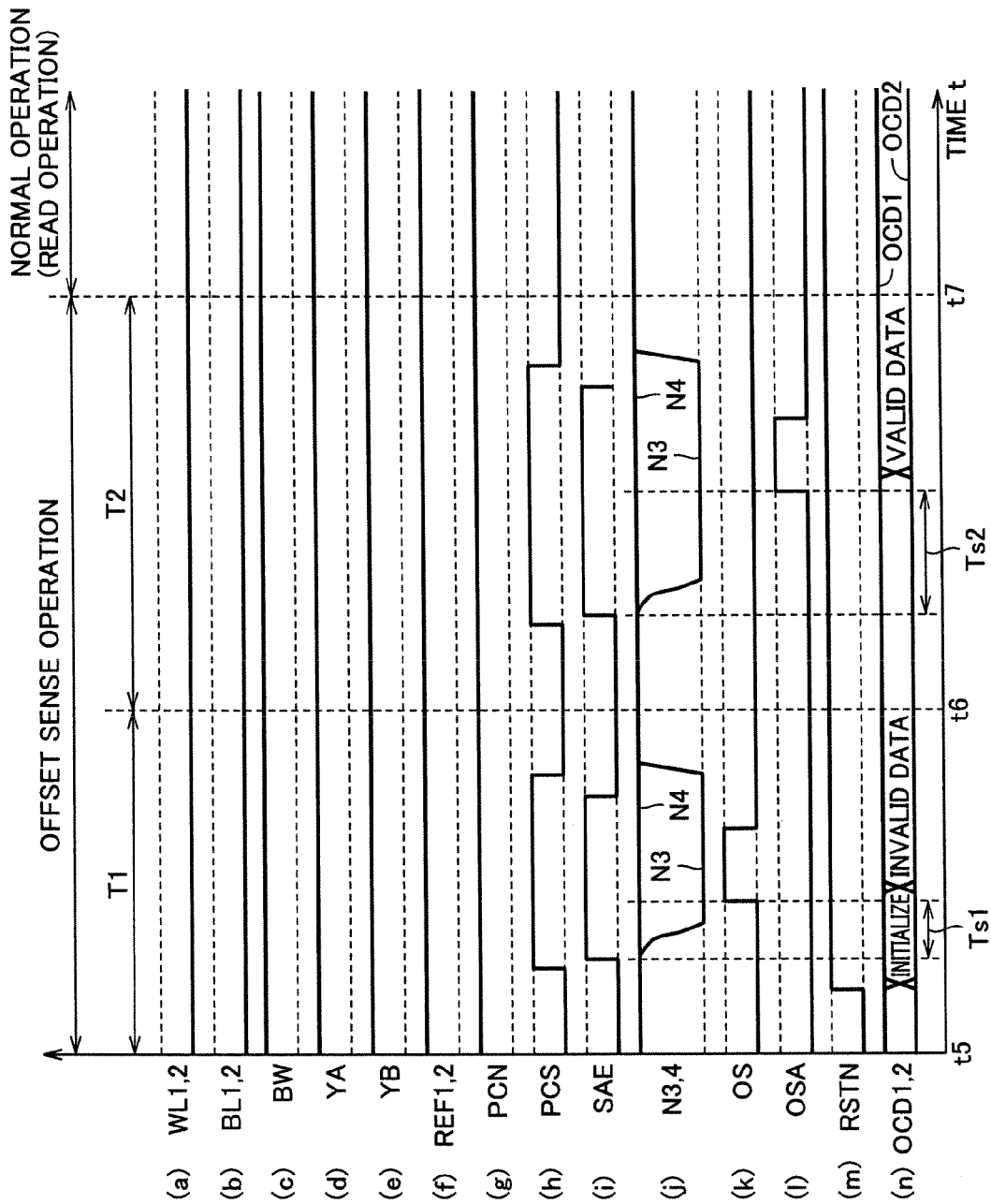
FIG. 14 is a time chart showing an offset sense operation and a read operation of the flash memory shown in FIG. 13.

FIGS. 14(a) to (n) are time charts showing an offset sense operation and a read operation of the flash memory shown in FIG. 13. These figures are in contrast with FIGS. 6(a) to (m). FIGS. 14(a) to (n) show a case where the two sense results agree.

In the first sense period T1, with sense amplifier 17 being cut off from nodes N1, N2, signals PCS, SAE are raised to "H" level to activate sense amplifier 17. FIG. 14(j) shows a state in which nodes N3 and N4 are at "L" level and "H" level, respectively. Signal OS is raised to "H" level for a predetermined time after a relatively short time Ts1 has elapsed since sense amplifier 17 is activated. As a result, transistors 51, 52 are rendered conductive for a predetermined time, and signals at nodes N3, N4 are latched at nodes N6, N7. Signals PCS, SAE are lowered to "L" level to complete the first sense period T1.

Next, in the second sense period T2, with sense amplifier 17 being cut off from nodes N1, N2, signals PCS, SAE are raised to "H" level to activate sense amplifier 17. FIG. 14(j) shows a state in which nodes N3 and N4 are at "L" level and "H" level, respectively. Signal OSA is raised to "H" level for a predetermined time after a relatively long time Ts2 has elapsed since sense amplifier 17 is activated. As a result, transistors 81, 82 are rendered conductive for a predetermined time, and signals at nodes N3, N4 are latched at nodes N8, N9.

In the example in FIGS. 14(a) to (n), since the two sense results agree, the output signals of EX-NOR gates 85, 86 both go to "H" level, and the inversion signals of the signals appearing at nodes N8, N9 become signals OCD1, OCD2. FIGS. 14(a) to (n) show a state in which signals OCD1 and OCD2 are set to "H" level and "L" level, respectively. In this case, transistor 23 in FIG. 3 is rendered non-conductive, and transistor 33 is rendered conductive, so that offset compensating current IOC flows out from node N2.

Figure 15:
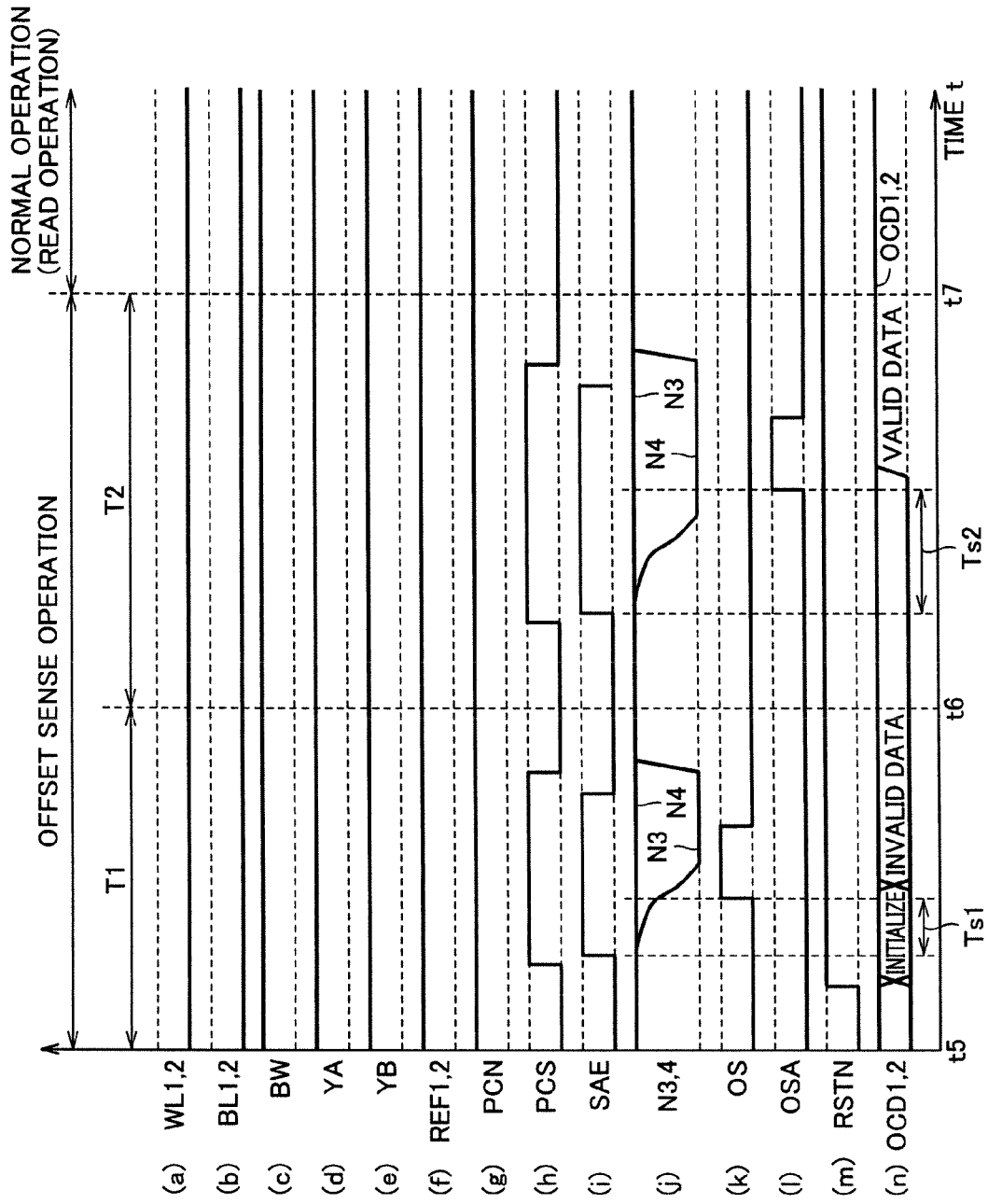
FIG. 15 is another time chart showing an offset sense operation and a read operation of the flash memory shown in FIG. 13.

FIGS. 15(a) to (n) are time charts showing an offset sense operation and a read operation of the circuit shown in FIG. 13. These figures are in contrast with FIGS. 14(a) to (n). FIGS. 15(a) to (n) show a case where the two sense results do not agree. In the first sense period T1, nodes N3 and N4 are at "L" level and "H" level, respectively. In the second sense period T2, nodes N3 and N4 are at "H" level and "L" level, respectively.

In the example in FIGS. 15(a) to (n), since the two sense results do not agree, the output signals of EX-NOR gates 85, 86 both go to "L" level, and signals OCD1, OCD2 are both fixed to "H" level. In this case, transistors 23, 33 in FIG. 3 are both rendered non-conductive, so that offset compensating current IOC does not flow out from nodes N1, N2.

The fifth embodiment achieves the same effects as in the first embodiment. In addition, the offset correction effect can be enhanced since offset correction is not performed when |VT1−VT2| is small.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a precharge circuit precharging first and second nodes to a predetermined voltage;
   a sense amplifier amplifying a voltage between said first and second nodes to output a first or second signal;
   an offset detection circuit activating said sense amplifier after said first and second nodes are precharged to said predetermined voltage by said precharge circuit to detect an offset voltage of said sense amplifier based on an output signal of said sense amplifier, in an offset sense operation; and
   an offset compensation circuit changing a voltage of said first or second node precharged by said precharge circuit, based on a detection result of said offset detection circuit, to compensate for the offset voltage of said sense amplifier, wherein
   said offset detection circuit includes a register holding an output signal of said sense amplifier in said offset sense operation, and
   said offset compensation circuit changes a voltage of said first or second node based on a signal held in said register.

2. The semiconductor device according to claim 1, wherein said register includes
   first and second switching elements having one electrodes connected to said first and second nodes, respectively, and being rendered conductive in said offset sense operation, and
   a latch circuit connected to the other electrodes of said first and second switching elements, and holding an output signal of said sense amplifier that is applied through said first and second switching elements.

3. The semiconductor device according to claim 1, wherein said offset sense operation is performed a plurality of times,
   said register holds output signals of a plurality of times of said sense amplifier, and
   if logics of said output signals of a plurality of times of said sense amplifier that are held in said register agree, said offset compensation circuit changes a voltage of said first or second node based on the signals, and if logics of the signals do not agree, said offset compensation circuit does not change voltages of said first and second nodes.

4. The semiconductor device according to claim 1, wherein said offset compensation circuit includes
   a first switching element and a first current source connected in series between said first node and a reference voltage line, and
   a second switching element and a second current source connected in series between said second node and said reference voltage line, and
   said first or second switching element is rendered conductive based on logic of a signal held in said register.

5. The semiconductor device according to claim 1, wherein said offset compensation circuit includes
   a first switching element and a first capacitor connected in series between said first node and a reference voltage line, and
   a second switching element and a second capacitor connected in series between said second node and said reference voltage line, and said first or second switching element is rendered conductive based on logic of a signal held in said register.

6. The semiconductor device according to claim 5, wherein said offset compensation circuit further includes
   a third switching element connected in parallel with said first capacitor and rendered conductive when said first switching element is rendered non-conductive, and
   a fourth switching element connected in parallel with said second capacitor and rendered conducive when said first switching element is rendered non-conductive.

7. The semiconductor device according to claim 1, wherein said offset sense operation is performed when a power supply voltage is applied to said semiconductor device.

8. The semiconductor device according to claim 1, wherein said offset sense operation is performed before normal operation in which said sense amplifier is activated.

9. The semiconductor device according to claim 1, further comprising:
   a memory cell applying current having a first or second value in accordance with logic of a data signal stored therein to said first node;
   a current source applying a reference current having a third value between said first and second values to said second node; and
   a read control circuit activating said sense amplifier after said first and second nodes are precharged to said predetermined voltage by said precharge circuit while said memory cell and said current source are activated, in a read operation.

10. The semiconductor device according to claim 1, further comprising:
    a first memory cell applying current having a first or second value in accordance with logic of a first data signal stored therein to said first node;
    a second memory cell storing a second data signal having logic different from said first data signal, and applying current having said first or second value in accordance with logic of said second data signal to said second node; and
    a read control circuit activating said sense amplifier after said first and second nodes are precharged to said predetermined voltage by said precharge circuit while said first and second memory cells are activated, in a read operation.

* * * * *